US010256601B2

(12) United States Patent
Yamaji et al.

(10) Patent No.: US 10,256,601 B2
(45) Date of Patent: Apr. 9, 2019

(54) OPTICAL MODULE IMPLEMENTING WITH OPTICAL SOURCE, OPTICAL MODULATOR, AND WAVELENGTH DETECTOR, AND A METHOD TO ASSEMBLE THE SAME

(71) Applicant: Sumitomo Electric Industries, Ltd., Osaka-shi (JP)

(72) Inventors: Kazuhiro Yamaji, Yokohama (JP); Yasushi Fujimura, Yokohama (JP); Toru Watanabe, Yokohama (JP); Yasuyuki Yamauchi, Yokohama (JP); Tomoya Saeki, Yokohama (JP); Munetaka Kurokawa, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 113 days.

(21) Appl. No.: 15/497,855

(22) Filed: Apr. 26, 2017

(65) Prior Publication Data

US 2017/0229839 A1    Aug. 10, 2017

Related U.S. Application Data

(63) Continuation of application No. 15/510,607, filed as application No. PCT/JP2015/005433 on Oct. 28, 2015.

(30) Foreign Application Priority Data

Oct. 28, 2014  (JP) .................................. 2014-219585
Nov. 21, 2014  (JP) .................................. 2014-236635
(Continued)

(51) Int. Cl.
*H01S 5/00* (2006.01)
*H04B 10/50* (2013.01)
(Continued)

(52) U.S. Cl.
CPC .......... *H01S 5/0085* (2013.01); *G02B 6/4224* (2013.01); *G02B 6/4244* (2013.01);
(Continued)

(58) Field of Classification Search
CPC ............... H01S 5/0085; H01S 5/02216; H01S 5/02248; H01S 5/02415; H01S 5/02446;
(Continued)

(56) References Cited

U.S. PATENT DOCUMENTS 6,477,190 B1    11/2002    Komiyama et al.
7,848,382 B2    12/2010    Weida et al.
(Continued)

FOREIGN PATENT DOCUMENTS

CN    102891436 A    1/2000
CN        1398030 A    2/2003
(Continued)

OTHER PUBLICATIONS

Office Action issued in U.S. Appl. No. 15/497,933 dated Mar. 22, 2018.
(Continued)

*Primary Examiner* — Armando Rodriguez
(74) *Attorney, Agent, or Firm* — Venable LLP; Tamatane J. Aga; Miguel A. Lopez

(57) ABSTRACT

An optical module and a method of assembling the optical module are disclosed. The optical module comprises a laser unit, a modulator unit, and a detector unit mounted on respective thermo-electric coolers (TECs). The modulator unit, which is arranged on an optical axis of the first output port from which a modulated beam is output, modulates the continuous wave (CW) beam output from the laser unit. On the other hand, the laser unit and the detector unit are arranged on another optical axis of the second output port from which another CW beam is output. The method of
(Continued)

assembling the optical module first aligns one of the first combination of the laser unit and the modulator unit with the first output port and the second combination of the laser unit and the detector unit, and then aligns another of the first combination and the second combination.

11 Claims, 33 Drawing Sheets

(30) Foreign Application Priority Data

| Dec. 11, 2014 | (JP) | 2014-251138 |
|---|---|---|
| Jan. 15, 2015 | (JP) | 2015-006130 |
| Jan. 20, 2015 | (JP) | 2015-008963 |

(51) Int. Cl.

| G02B 6/42 | (2006.01) |
|---|---|
| H01S 5/022 | (2006.01) |
| H01S 5/024 | (2006.01) |
| H01S 5/0687 | (2006.01) |
| G02F 1/225 | (2006.01) |
| G02B 27/09 | (2006.01) |
| G02B 27/14 | (2006.01) |
| G02B 27/30 | (2006.01) |
| H01S 5/026 | (2006.01) |
| H01S 5/06 | (2006.01) |
| H01S 5/0625 | (2006.01) |
| G02F 1/21 | (2006.01) |

(52) U.S. Cl.
CPC ....... *G02B 6/4271* (2013.01); *G02B 27/0955* (2013.01); *G02B 27/141* (2013.01); *G02B 27/30* (2013.01); *G02F 1/2255* (2013.01); *H01S 5/02216* (2013.01); *H01S 5/02248* (2013.01); *H01S 5/02415* (2013.01); *H01S 5/02446* (2013.01); *H01S 5/0687* (2013.01); *H04B 10/505* (2013.01); G02B 6/4214 (2013.01); G02B 6/4227 (2013.01); G02B 6/4239 (2013.01); G02B 6/4265 (2013.01); G02F 2001/212 (2013.01); H01L 2224/48091 (2013.01); H01L 2224/4903 (2013.01); H01L 2924/19107 (2013.01); H01S 5/005 (2013.01); H01S 5/0071 (2013.01); H01S 5/0265 (2013.01); H01S 5/02284 (2013.01); H01S 5/02476 (2013.01); H01S 5/0612 (2013.01); H01S 5/06256 (2013.01); H01S 5/06258 (2013.01)

(58) Field of Classification Search
CPC ........ H01S 5/0687; H01S 5/505; H01S 5/005; H01S 5/0071; H01S 5/0265; H01S 5/0612; H01S 5/06256; H01S 5/06258; G02B 6/4244; G02B 6/4224; G02B 6/4271; G02B 27/0955; G02B 27/141; G02F 1/2255
See application file for complete search history.

(56) References Cited

U.S. PATENT DOCUMENTS

| 8,885,677 | B1 | 11/2014 | Kupershmidt et al. |
|---|---|---|---|
| 2002/0003641 | A1 | 1/2002 | Hall et al. |
| 2003/0095737 | A1 | 5/2003 | Welch et al. |
| 2004/0101016 | A1 | 5/2004 | McDonald et al. |
| 2006/0239605 | A1 | 10/2006 | Palen et al. |
| 2007/0024976 | A1 | 2/2007 | Schluchter et al. |
| 2010/0215315 | A1 | 8/2010 | Hamana et al. |
| 2011/0173870 | A1 | 7/2011 | Day et al. |
| 2012/0189306 | A1 | 7/2012 | Du et al. |
| 2013/0148966 | A1 | 6/2013 | Kurokawa et al. |
| 2014/0192830 | A1 | 7/2014 | Blauvelt et al. |
| 2015/0055665 | A1 | 2/2015 | Nakajima |
| 2015/0104177 | A1* | 4/2015 | Kato .............. H04B 10/40 398/79 |
| 2016/0103286 | A1* | 4/2016 | Matsui ............ G02B 6/3812 398/139 |

FOREIGN PATENT DOCUMENTS

| CN | 202661662 U | 1/2013 |
|---|---|---|
| JP | 2004-096092 A | 3/2004 |
| JP | 2007-080932 A1 | 7/2007 |
| JP | 2014-503857 A | 2/2014 |
| WO | 2012/100209 A2 | 7/2012 |
| WO | 2013/180291 A1 | 12/2013 |

OTHER PUBLICATIONS

Notice of Allowance issued in U.S. Appl. No. 15/460,045, dated Jun. 30, 2017.
Notice of Allowance dated Aug. 15, 2018 in U.S. Appl. No. 15/497,933.
Office Action issued in U.S. Appl. No. 15/497,907 dated May 23, 2018.
Office Action issued in U.S. Appl. No. 15/510,607, dated May 29, 2018.
Notice of Allowance dated Oct. 3, 2018 in U.S. Appl. No. 15/510,607.

* cited by examiner

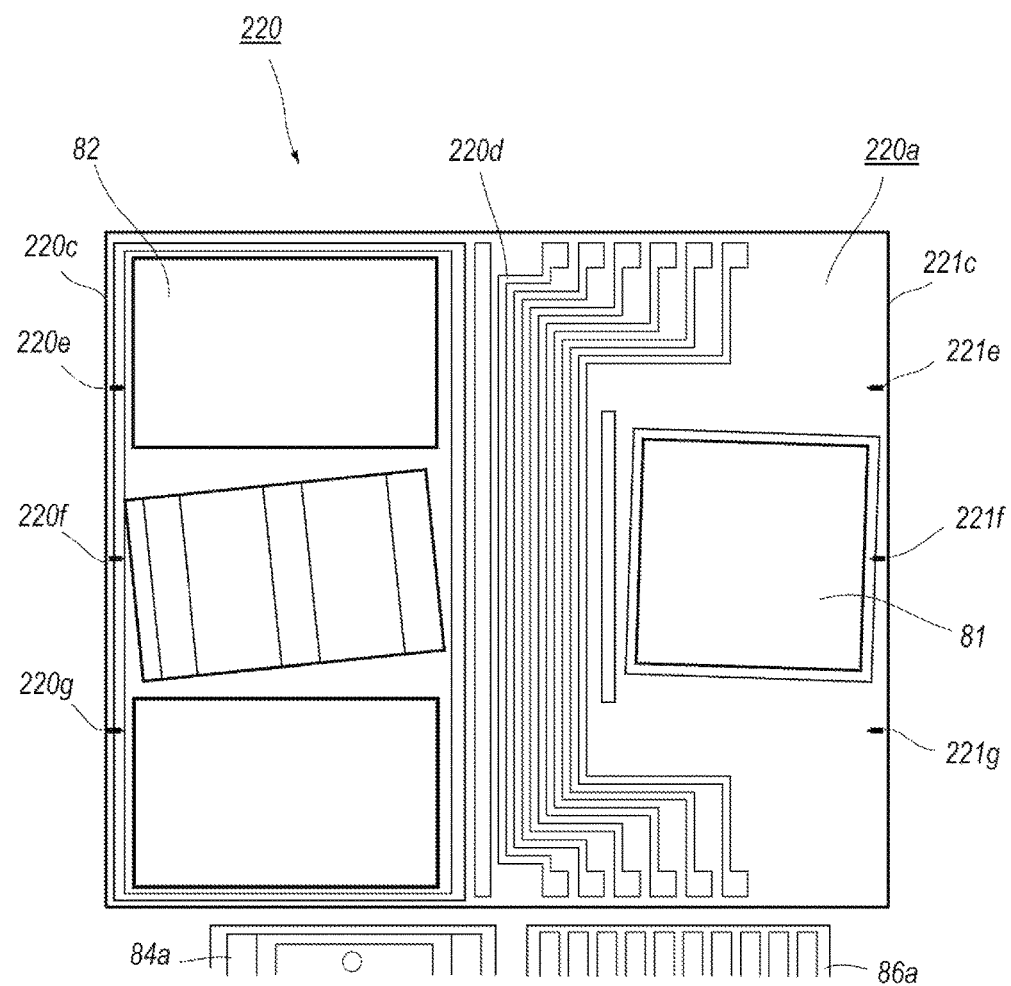

OPTICAL MODULE IMPLEMENTING WITH OPTICAL SOURCE, OPTICAL MODULATOR, AND WAVELENGTH DETECTOR, AND A METHOD TO ASSEMBLE THE SAME

CROSS REFERENCE TO RELATED APPLICATIONS

This application is a Continuation of U.S. patent application Ser. No. 15/510,607, filed Mar. 10, 2017, which is a 371 National Phase of PCT/JP2015/005433, filed Oct. 28, 2015, which claims the benefit of Japanese Patent Application No. 2014-219585, filed Oct. 28, 2014. Japanese Patent Application No. 2014-236635, filed Nov. 21, 2014, Japanese Patent Application No. 2014-251138, filed Dec. 11, 2014, Japanese Patent Application No. 2015-006130, filed Jan. 15, 2015, and Japanese Patent Application No. 2015-008963, filed Jan. 20, 2015.

TECHNICAL FIELD

The present invention relates to an optical module that installs an optical source including a semiconductor laser diode (LD), an optical modulator, and a wavelength detector; and the invention further relates to a method of assembling the optical module.

BACKGROUND ART

An optical module that installs a wavelength tunable semiconductor laser diode (t-LD) and an optical modulator that modulates CW light emitted from the t-LD has been well known in the field. A Japanese patent application laid open No. 2009-146992 has disclosed such an optical module. The CW light output from the t-LD optically couples with the optical modulator via optical fibers. However, an optical fiber when it is bent with a large curvature causes a bent loss. Accordingly, when an optical transceiver with limited sizes in a housing thereof installs a t-LD and an optical modulator, techniques to compensate the bent loss caused in inner fibers is needed.

SUMMARY OF INVENTION

One aspect of the present application relates to a process of assembling an optical module that installs a laser unit, a modulator unit, and a detector unit within a housing. The laser unit includes a semiconductor laser diode (LD) having a front facet that outputs a first continuous wave (CW) beam and a rear face that outputs a second CW beam. The modulator unit modulates a first CW beam. The detector unit determines a wavelength of the second CW beam. The housing includes a first output port and a second output port. The process of the present application comprises steps of: (1) installing a first thermo-electric cooler (TEC), a second TEC, and a third TEC within the housing; (2) mounting the laser unit on the first TEC, the modulator unit on the second TEC, and the detector unit on the third TEC, respectively; (3) optically coupling one of the first CW beam with a first output port of the housing through the modulator unit and the second CW beam with a second output port of the housing through the detector unit; and (4) optically coupling another of the first CW beam with the first output port of the housing through the modulator unit and the second CW beam with the second output port of the housing through the detector unit. One of features of the process of the present application is that the step of coupling the first CW beam with the first output port includes steps of: (3-1) optically coupling the laser unit with the optical modulator through the input unit, and (3-2) optically coupling the modulator unit with the first output port through the output unit. Another feature of the present method is that the step of coupling the second CW beam with the second output port includes steps of: (4-1) optically coupling the detector unit with the laser unit and (4-2) optically coupling the detector unit with the second output port.

Another aspect of the present application relates to an optical module that comprises a wavelength tunable laser diode (t-LD) having a first facet and a second facet, an optical modulator, a wavelength detector, a housing, and first and second output ports. The t-LD outputs a first CW beam from the first facet and a second CW beam from the second facet. The optical modulator, which is primarily made of semiconductor materials, generates a first output beam by modulating the first CW beam. The wavelength detector, which may determine an oscillation wavelength of the t-LD, splits the second CW beam into a monitored beam and a second output beam. The housing, which includes a front wall, a rear wall, and two side walls connecting the front wall to the rear wall, encloses the t-LD, the optical modulator, and the wavelength detector in a space partitioned by the front wall, the rear wall, and the side walls. The first output port and the second output port, which are provided in the front wall, output the first output beam and the second output beam, respectively. One feature of the optical modulator of the present application is that the wavelength detector and the t-LD are arranged on an optical axis of the second output port along one of the side walls, but, the optical modulator is arranged on an optical axis of the first output port along another of the side walls. The optical modulator of the present application further provides a feature that the optical modulator has an input port, an output port, and a signal pad, where the input port is provided in a side of the optical modulator facing the one of the side walls of the housing, the output port is provided in a side of the optical modulator facing the front wall of the housing, and the signal pad is provided in a side of the optical modulator facing the rear wall, where the signal pad provides a signal containing high frequency components.

Still another aspect of the present application relates to an optical module. The optical module of the present aspect comprises an optical source, an optical modulator, and an input unit. The optical source, which is mounted on a first TEC as interposing a first carrier therebetween, generates a continuous wave (CW) beam, where the first carrier provides marks thereon. The optical modulator, which is mounted on a second TEC independent of the first TEC as interposing a base therebetween, modulates the CW beam. The input unit, which couples the CW beam with the optical modulator, is mounted on the base as interposing a second carrier therebetween, where the second carrier provides marks thereon. One feature of the present optical module is that the marks on the second carrier of the input unit are aligned with the marks on the first carrier of the optical source.

Still another aspect of the present application relates to an optical module. The optical module of the present aspect includes an optical source, an optical component, a housing, and a beam shifter. The optical source generates a beam accompanied with an optical axis. The optical component, which is optically coupled with the optical source, has another optical axis offset from the optical axis of the beam. The housing having a bottom disposes the optical source and the optical component on the bottom thereof. The beam shifter is interposed between the optical source and the optical component. A feature of the optical module of the present aspect is that the beam shifter aligns the optical axis of the beam measured from the bottom of the housing with the other optical axis of the optical component measured from the bottom of the housing.

Still another aspect of the present application relates to a method of assembling an optical module that provides an optical source, beam shifter, an optical component, a concentrating lens, and a housing. The optical source generates an optical beam. The optical component is optically coupled with the optical beam. The concentrating lens concentrates the optical beam on the optical component. The housing, which has a bottom, encloses the optical source, the concentrating lens, and the optical component therein. The method comprises steps of: (1) disposing the beam shifter between the optical source and the concentrating, where the beam shifter aligns an optical axis of the optical beam measured from the bottom of the housing to an optical axis of the optical component; and (2) coupling the optical beam output from the beam shifter with the optical component by aligning the concentrating lens.

BRIEF DESCRIPTION OF DRAWINGS

FIG. 15 is a plan view of a joint unit;

DESCRIPTION OF EMBODIMENTS

Next, some preferred embodiments will be described as referring to drawings. In the description of the drawings, numerals or symbols same with or similar to each other will refer to elements similar to or same with each other without overlapping explanations.

First Embodiment

Figure 1:
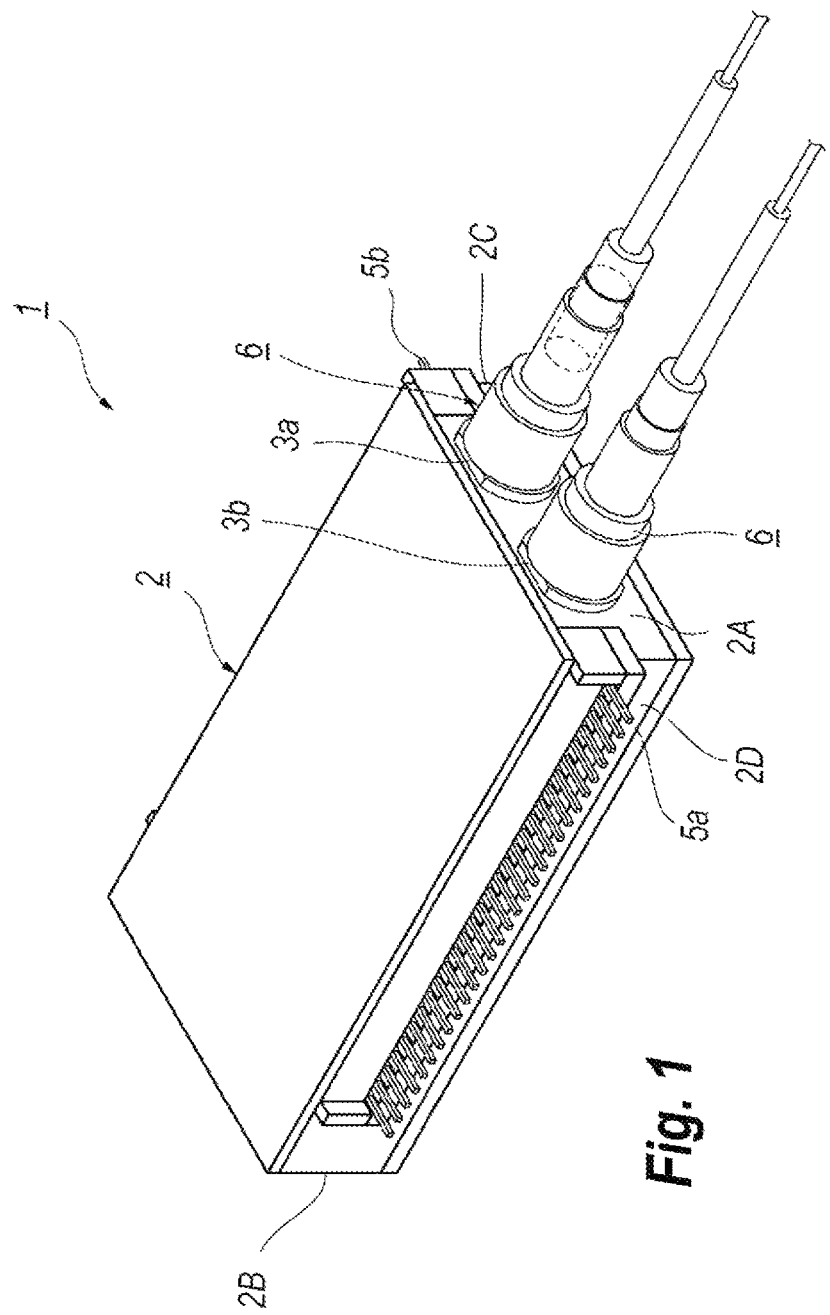
FIG. 1 is a perspective view of an optical module according to an embodiment of the present invention.
Figure 2:
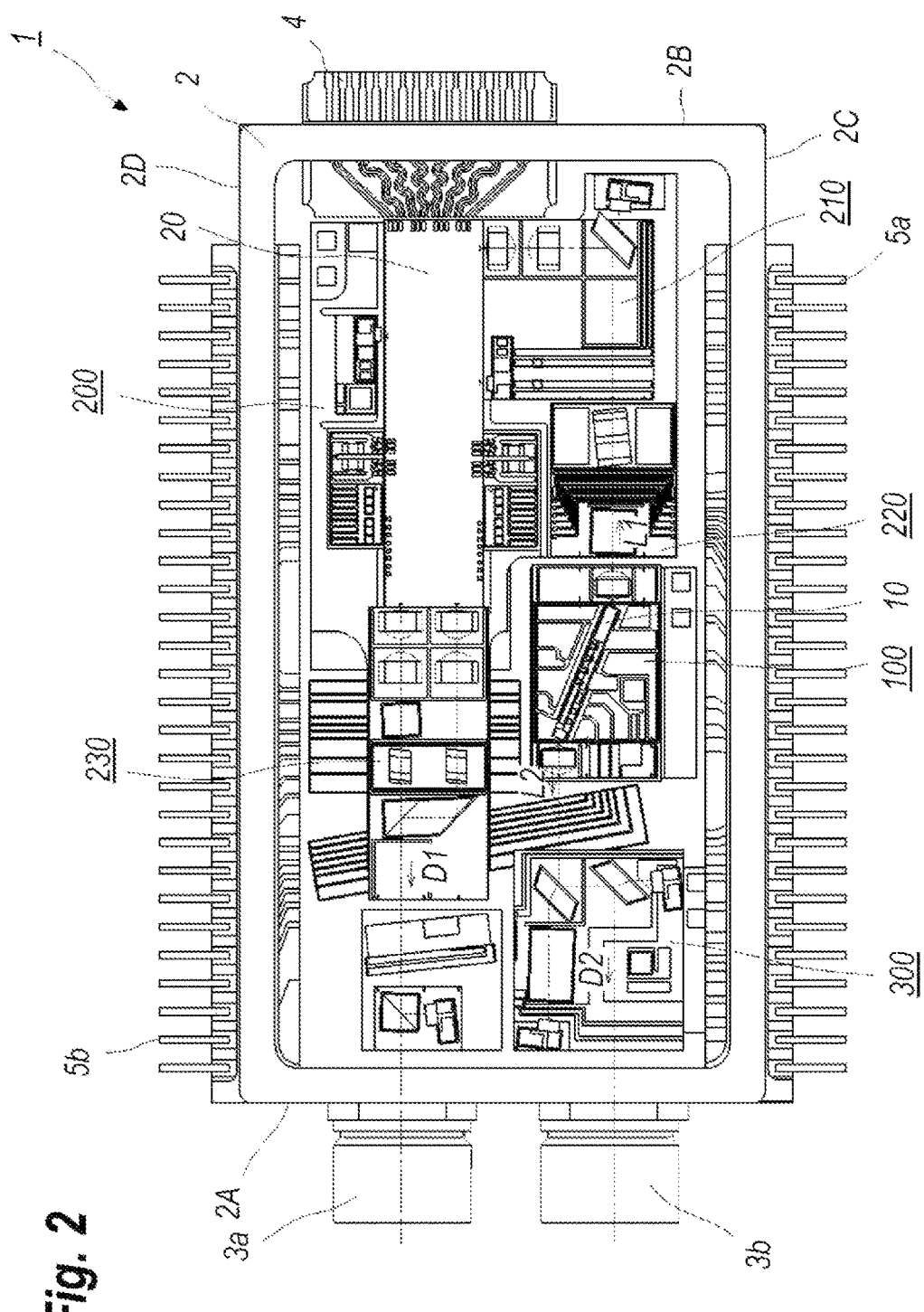
FIG. 2 shows an inside of the optical module shown in FIG. 1.

FIG. 1 is a perspective view of an optical module according to an embodiment of the present invention and FIG. 2 shows an inside of the optical module shown in FIG. 1. The optical module 1 of the present embodiment may be implemented within an optical transceiver applicable to the optical coherent system. The optical coherent system utilizes the phase of light, in addition to the magnitude thereof, as one bit information. When the optical signals corresponding to the phase components of 0° and 90°, that is, when the coherent system multiplexes the optical signals each having the phase components of 0° and 90°, the system may transmit two-bits information at the same time.

The optical module 1 includes a laser unit 100, a modulator unit 200, and a detector unit 300 within a housing partitioned by a front wall 2A, a rear wall 2B, and two side walls, 2C and 2D, connecting the front wall 2A to the rear wall 2B. The laser unit 100 optically couples with both the modulator unit 200 and the detector unit 300. Specifically, the optical module 1 outputs a modulation signal D1 from the first output port 3a, where the modulation signal D1 is obtained by modulating first continuous wave (CW) beam L1 output from a wavelength tunable laser diode (t-LD) 10 implemented within the laser unit 100 by an optical modulator 20 installed in the modulator unit 200. Concurrently with the first modulation signal D1, the optical module 1 may output another optical signal D2 from the second output port 3b, where the optical signal D2 is originated from the other CW beam L2 output from the t-LD 10 to the detector unit 300 and divided in the detector unit 300. The first CW beam L1, which is output from the t-LD 10 substantially in parallel to the optical axes of the output ports, 3a and 3b, toward the rear wall 3B, enters the optical modulator 20 along the rear wall 2B bent by substantially 90°. The other CW beam L2, which is emitted from the t-LD 10 substantially in parallel to the optical axes of the output ports, 3a and 3b, toward the front wall 2A.

The optical module 1 of the present embodiment has a feature that the optical module 1 mounts the laser unit 100, the modulator unit 200, and the detector unit 300 on respective thermo-electric coolers (TECs) implemented in the housing independently. Moreover, the optical module 1 provides radio-frequency (RF) terminals 4 only in the rear wall 2B, and DC terminals, 5a and 5b, in the respective side walls, 2C and 2D. Because the RF terminals 4 and the DC terminals, 5a and 5b, are independent in respective walls; the electrical control of the optical module 1 may be simplified and stabilized.

The modulator unit 200, as described above, modulates the first CW beam L1 in the phase thereof and outputs the phase-modulated optical signal. That is, the optical modulator 20 implemented within the modulator unit 200 divides the first CW beam L1 into four beams, and modulates these four beams independently by four modulation signals provided through the RF terminals 4, where two of four modulated signals output from the optical modulator 20 have phase components different by 90° from the rest of two modulated signals. The former two modulated signals are often called as I-components (In-phase component), while, the latter two modulated signals are called as Q-components (Quadrature component). One of I-components and one of Q-components are further modulated by the polarization thereof. That is, one of the I-components and one of the Q-components are rotated in the polarization thereof and multiplexed with the other of the I-components and the other of the Q-components. The optical module 1 may output the modulated signal D1, which multiplexes four optical signals, from the first output port 3a as the phase-polarization modulated signals, which is often called as the dual polarization quadrature phase shift keying (DP-QPSK). The optical module 1 may further output another optical signal D2, which is obtained by dividing the second CW beam L2 output from the t-LD 10 by the detector unit 300. One of the divided CW beam is used for determining the wavelength of the CW beam L2, and the rest is output from the second output port 3b as the output CW beam D2.

Next, details of the respective units, 100 to 300, will be described.

tunable Laser Diode (t-LD)

Figure 3:
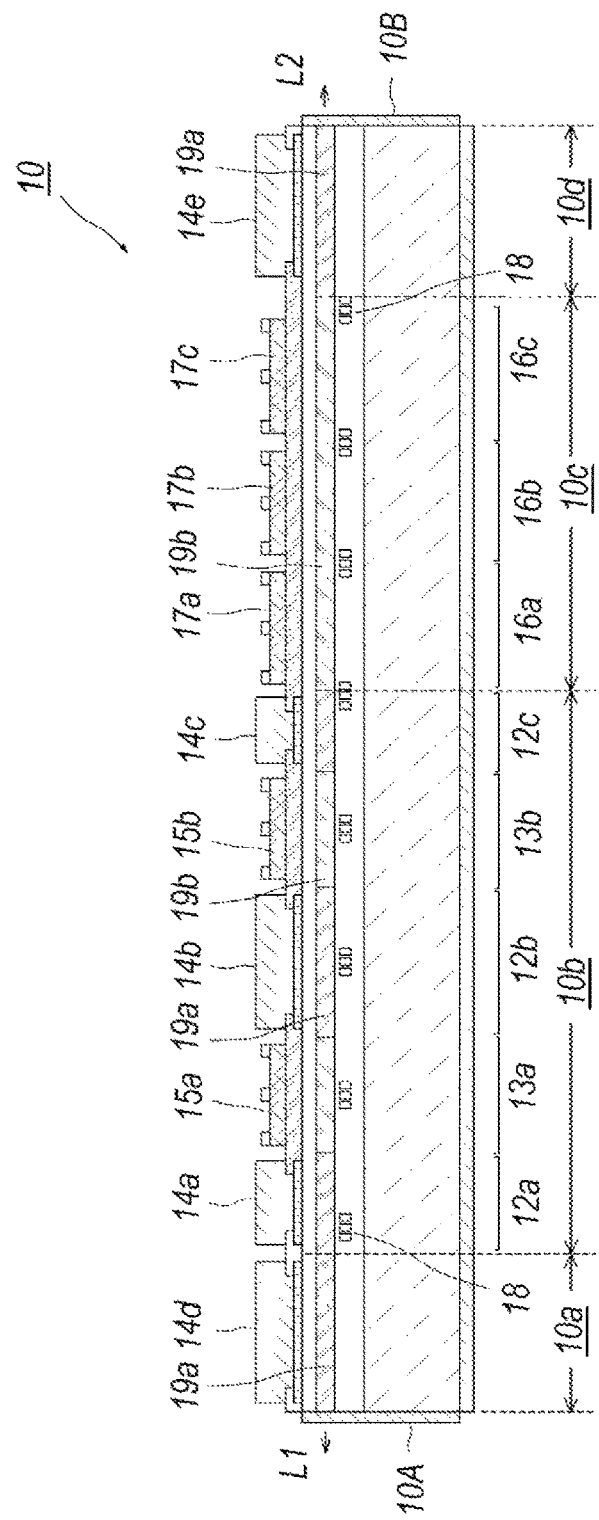
FIG. 3 shows a cross section of a wavelength tunable LD implemented within the optical module shown in FIG. 1.

FIG. 3 shows a cross section of a wavelength tunable LD implemented within the optical module shown in FIG. 1. The t-LD 10 includes two semiconductor optical amplifiers SOAs, 10a and 10d, and a sampled grating distributed feedback (SG-DFB) 10b and a sampled grating distributed Bragg reflector (SG-DBR) 10c, where the latter two regions, 10b and 10c, may determine the emission wavelength of the t-LD 10. These four regions are arranged along an optical axis of the t-LD 10. The present t-LD 10 provides one facet 10A in one of the SOA 10a to transmit the first CW beam L1 and another facet 10B in the other SOA 10d to transmit the second CW beam L2.

The SG-DFB 10b includes a sampled grating (SG) 18, where the sampled grating 18 is featured by regions each including a plurality of gratings and separated by spaces without any gratings. The gratings in respective regions have a constant pitch and the spaces have a constant length along the optical axis. When the spaces have various lengths, the sampled grating may be called as the chirped-sampled grating. The SG-DFBs 10b includes gain regions, 12a to 12c, including the SG 18, and modulation regions, 13a and 13b, also including the SG 18. The gain regions, 12a to 12c, may be provided with carriers through electrodes 14a on a top surface of the device. On the other hand, the modulation regions, 13a and 13b, provides heaters, 15a and 15b, in the top surface thereof. A combination of the gain regions, 12a to 12c, and the modulation regions, 13a and 13b, the SG-DFB 10b may show the optical gain spectrum having a plurality of gain peaks reflecting the SG 18 in the SG-DFB 10b. Providing power to the heaters, 15a and 15b, that is, heating up or cooling down temperatures of the waveguide layers 19b beneath the heaters, 15a and 15b, optical characteristics of the modulation regions, 13a and 13b, may be modified, that is, wavelengths of the gain peaks inherently attributed to the SG-DFB 10b may be changed.

The CSG-DBR 10c of the present embodiment provides three sections, 16a to 16c, each having heaters, 17a to 17c, operable independently. Because the CSG-DBR 10c does not includes any gain regions, the CSG-DBR 10c inherently show reflection spectrum having a plurality of reflection peaks. Powering the heaters, 17a to 17c, to modify temperatures of the waveguide 19b beneath the heaters, 17a to 17c, the reflection peaks in the spectrum of the CSG-DBR 10c may be changed in the wavelengths and intervals thereof. At least one of the sections, 16a to 16c, has physical features distinguishable from those of the rest sections. In the present t-LD 10, the section, 16a to 16c, provides optical lengths different from others. That is, the spaces without diffraction gratings have respective optical lengths different from others, which are called as the chirped-sampled diffraction Bragg reflector (CSG-DBR). The reason why the t-LD 10 of the present embodiment provides the CSG-DBR, not the SG-DBR, is that a range where the reflection peaks appears may be widened by modifying the temperatures of the waveguides in respective regions independently. Adjusting the power supplied to the heaters, 15a and 15b, in the SG-DFB 10b and the heaters, 17a to 17c, in the CSG-DBR 10c, one of the gain peaks attributed to the SG-DFB 10b matches with one of the reflection peaks attributed to the CSG-DBR 10c. Then, the SG-DFB 10b and the CSG-DBR 10c may form a cavity for the t-LD 10 and the t-LD may oscillate at the matched wavelength. This matched wavelength is optional by adjusting the power supplied to the heaters, 15a and 15b, and 17a to 17c.

The first and second SOAs, 10a and 10d, may amplify an optical beam generated by the gain regions, 12a to 12c, and determined in the wavelength thereof by the optical coupling of the SG-DFB 10b with the CSG-DBR 10c. The optical gain of the SOAs, 10a and 10d, may be variable by injecting carries into the active layer 19a through the electrode 14d in the first SOA 10a, and carries into the other active layer 19a through the electrode 14e in the second OSA 10d. Thus, the amplitude of the first and second CW beam, L1 and L2, are variable. The waveguide 19b in the modulation regions, 13a and 13b, in the SG-DFB 10b and that in the CSG-DBR 10c may be made of semiconductor material with energy band gap greater than that of the active layer 10a in the SOAs, 10a and 10b, and the gain regions, 12a to 12c, in the SG-DFB 10b to make the waveguide 19b substantially in transparent for the optical beam subject to the t-LD 10.

Figure 4:
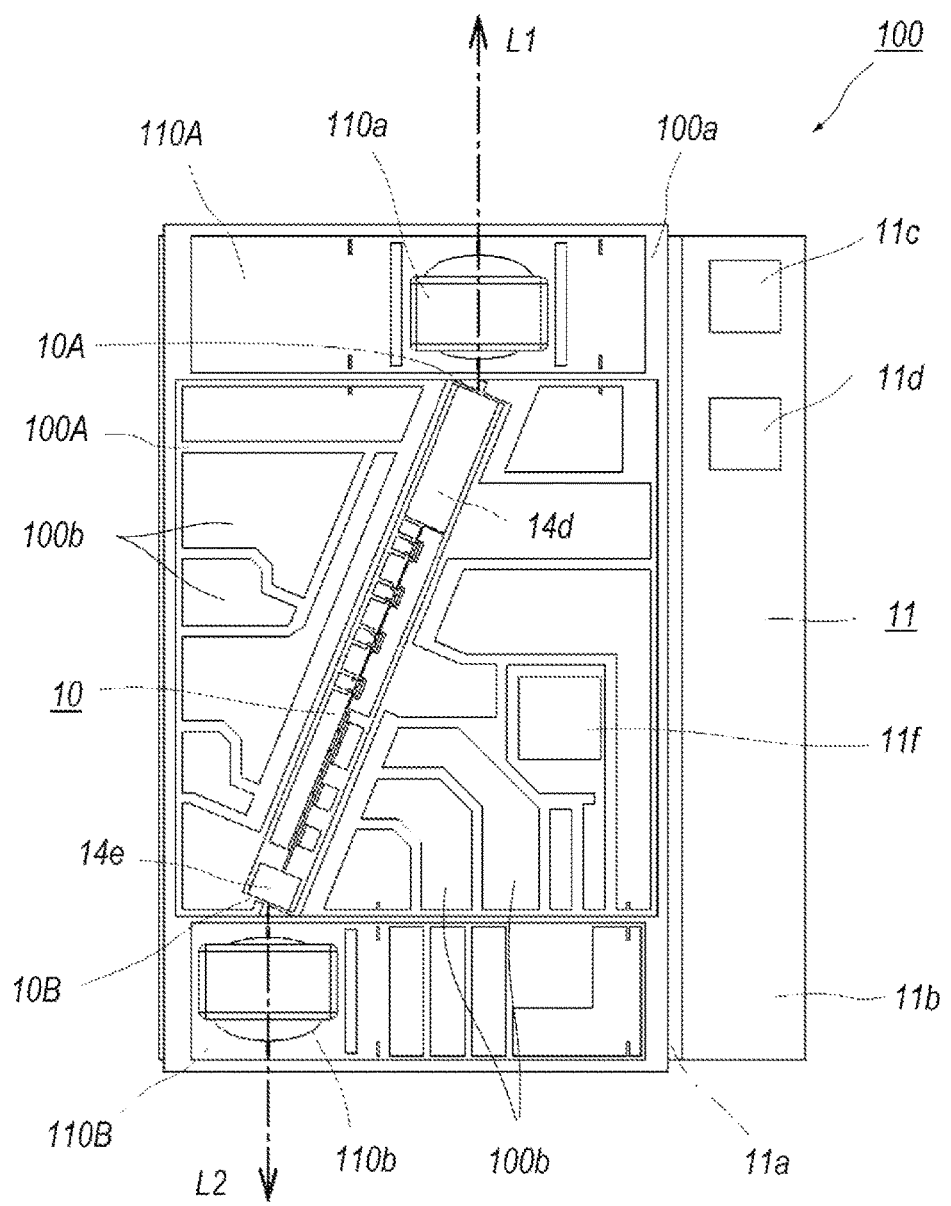
FIG. 4 is a plan view of a laser unit.

FIG. 4 is a plan view of a laser unit 100. The laser unit 100 includes a first thermo-electric cooler (TEC) 11 that mounts two collimating lenses, 110a and 110b, and the t-LD 10 through a base 100a. Specifically, the first TEC 11, which includes a top plate 11a, a bottom plate 11b, and a plurality of thermo-electric converting elements, typically Peltier elements, may cause a temperature difference between two plates, 11a and 11b, depending on a magnitude and a direction of a current flowing in the Peltier elements. The bottom plate 11b has a size wider than that of the top plate 11a. That is, the bottom plate 11b has a portion exposed from the top plate 11a, and two posts, 11c and 11d, to supply the current to the Peltier elements on the bottom plate 11b. The temperature of the top plate 11a may be sensed by a thermistor 11f mounted on the top plate 11a.

The base 100a, which has a size substantially same with that of the top plate 11a of the first TEC 11, may be made of aluminum nitride (AlN) and mounts two collimating lenses, 110a and 110b, through respective lens carriers, 110A and 110B, and the t-LD 10 and the thermistor 11f through an LD carrier 100A. These carriers, 100A, 110A and 110B, may be also made of AlN but the LD carrier 100A has a thickness greater than respective thicknesses of the lens carriers, 110A and 110B, to match the level of the optical axis of the t-LD 10 with those of the collimating lenses, 110a and 110b. The LD carrier 100A provides interconnections 100b thereon to provide biases to the t-LD 10. The t-LD 10 is necessary to be supplied with a bias to inject carriers into the gain regions, 12a to 12c, power to the heaters, 15a and 15b, in the SG-DFB 10b, power to the heaters, 17a to 17c, in the CSG-DBR 10c, biases to the SOAs, 10a to 10d, to secure the optical gains therein, and some grounds. The LD carrier 100A requires the interconnections 100b to supply these biases and power to the t-LD 10.

Optical Modulator

Figure 5:
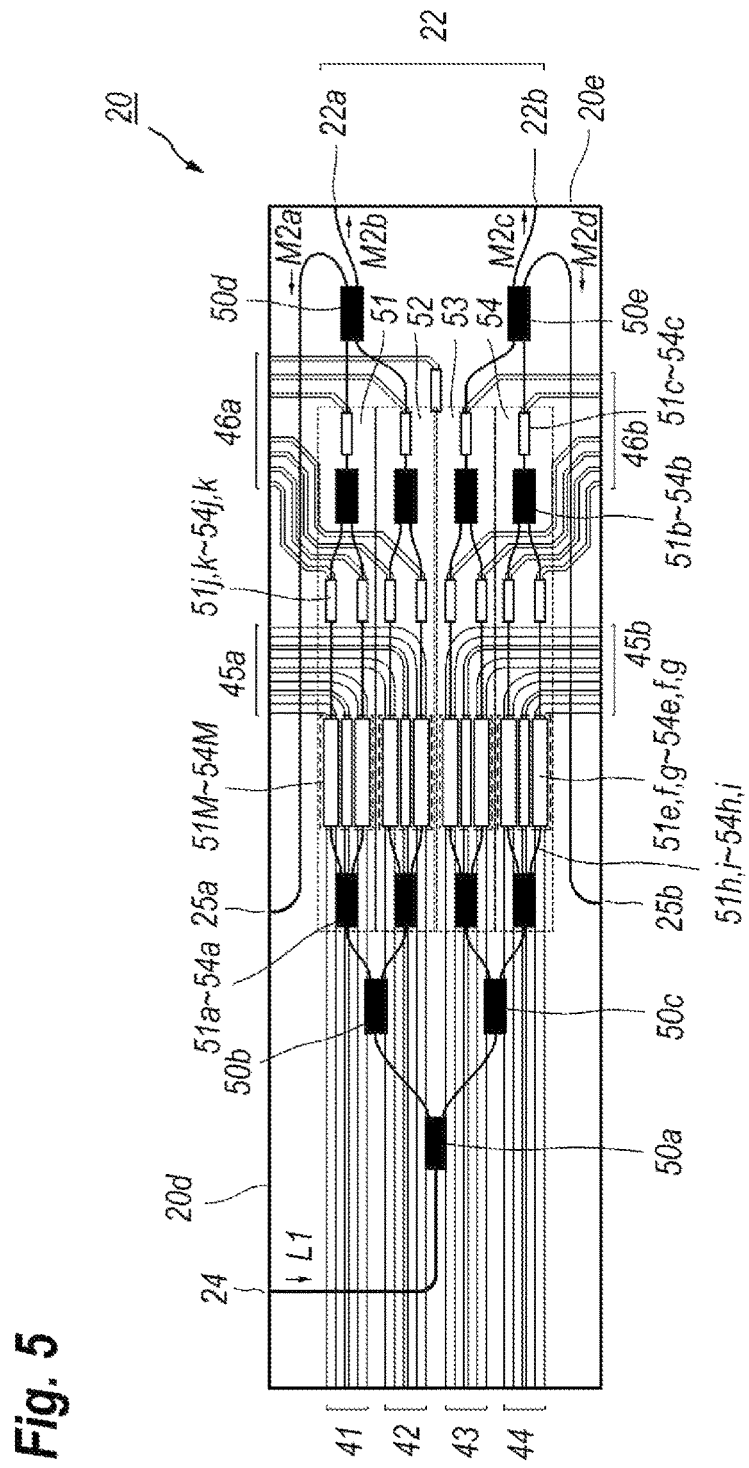
FIG. 5 is a plan view of an optical modulator.

FIG. 5 is a plan view of an optical modulator. The optical modulator 20 may include a plurality of modulation elements, for example four (4) Mach-Zehnder (MZ) elements, 51 to 54, are integrated on a semiconductor substrate made of indium phosphide (InP) in the present embodiment. The optical modulator 20 of the embodiment includes three 1:2 couplers, 50a to 50c, to distribute the CW beam L1 entering from the input port 24 into four MZ elements, 51 to 54. Specifically, the CW beam L1 entering the input port 24 is bent substantially in a right angle along the waveguide and evenly divided into two partial beams by the first 1:2 coupler 50a. The respective partial beams are further evenly divided by the second and third 1:2 couplers, 50b and 50c, into four partial beams, and the four partial beams enter the MZ elements, 51 to 54, respectively. Two 2:2 couplers, 50d and 50e, are provided in downstream of the MZ elements, 51 to 54, to multiplex the modulated beam.

The explanation below concentrates on the first MZ element 51. But, other MZ elements, 52 to 54, may operate in the same manner with the first MZ element 51.

The partial CW beam divided by the second 1:2 coupler 50b and entering the MZ element 51 is further evenly divided into two portions by the 1:2 coupler 51a each heading the arm waveguides, 51h and 51i. In the arm waveguides, 51h and 51i, in particular, within the functional region 51M providing the modulating electrodes, 51e and 51f, and the ground electrode 51g, the divided beam are modulated in the phases thereof. After passing the functional region 51M, the divided beam in the phases thereof are further modulated, or offset in the offset electrodes, 51j and 51k. Finally, the divided beams are combined by the 1:2 coupler 51b to be output from the MZ element 51.

The operation of the functional region 51M and the offset electrodes, 51j and 51k, will be described. The offset electrodes, 51j and 51k are statically pre-biased such that the optical beams propagating in the respective arm waveguides, 51h and 51j, have a phase difference of pi ($\pi$). For instance, the optical beam propagating in the one arm waveguide 51h is delayed by pi ($\pi$) with respect to the beam propagating in the other arm waveguide 51j. Then, one of the modulating electrodes 51e for the arm waveguide 51h is supplied with a bias to cause the phase delay of pi ($\pi$) but the other modulation electrode 51f is supplied with a bias causing no phase delay. The beam propagating in the arm waveguide 51h is caused by the phase delay of $2\pi$ by the modulation electrode 51e and the offset electrode 51j; but, the beam propagating in the other arm waveguide 51i shows no phase delay caused by the modulation electrode 51f and the offset electrode 51k. Combining two optical beams each propagating in the arm waveguides, 51h and 51i; the combined beam shows a phase delay of zero. The phase delay of $2\pi$ is equal to the phase delay of 0.

On the other hand, when the modulation electrode 51e is supplied with a bias causing no phase delay for the beam propagating in the arm waveguide 51h thereunder but the other modulation electrode 51f is supplied with a bias causing the phase delay of pi ($\pi$); the beam combined by the 2:1 coupler 51b has the phase delay of pi ($\pi$) because the former beam propagating in the arm waveguide 51h is delayed in the phase thereof by the static bias of the offset electrode 51j. Thus, the optical output of the MZ element 51 becomes CW beam whose phase is modulated between 0 and pi ($\pi$) but the amplitude thereof is kept substantially constant. The amplitude of the optical output strictly changes at the transitions of the phase. Referring to FIG. 5, the modulation signals provided to the modulation electrodes, 51e to 54e and 51f to 54f, are supplied from the pads, 41 to 44, which are formed in one edge of the optical modulator 20, through interconnections which are terminated at pads, 45a and 45b, provided in respective sides of the optical modulator 20 in downstream of the modulation electrodes, 51e to 54e and 51f to 54f. Also, the static biases supplied to the offset electrodes, 51j to 54j and 51k to 54k, are provided from the pads, 46a and 46b, formed in respective sides of the optical modulator 20.

The quadrature electrodes, 51c to 54e, in the function thereof will be described. The optical modulator 20 of the embodiment includes four (4) MZ elements, 51 to 54. The two quadrature electrodes, 52c and 54c, are supplied with static biases such that the phases of the beams propagating thereunder cause a phase difference of $\pi/2$ with respect to the other beams propagating in the waveguides under the quadrature electrodes, 51c and 53c, which form the pairs with the respective quadrature waveguides, 52c and 54c. Accordingly, even after combining two optical beams each propagating in the waveguides under the quadrature electrodes, 51c and 52c, 53c and 54c, the optical beams may be independently extracted. The optical beams output from the MZ elements, 51M and 52M, and those from the MZ elements, 53M and 54M, may be multiplexed with respect to the phases, one of the optical beams, subject to the MZ elements, 51M and 53M, are called as the I-component (In-phase), and the other is called as the Q-component (Quadrature). The optical modulator 20 may output two optical signals, M2b and M2c, each modulated in the phase, from respective output ports, 22a and 22b, and other two optical signals, M2a and M2d, from respective monitor ports, 25a and 25b.

In the optical modulator 20 thus described, the modulation of the optical beams may be carried out by varying refractive index of the waveguide made of semiconductor materials in the functional regions, 51M to 54M. A semiconductor material shows a large electro-optical coupling efficiency, which is called as the Kerr effect, for the optical beam whose wavelength is slightly longer than a bandgap wavelength of the semiconductor material, which corresponds to the bandgap energy of the material. A larger Kerr efficiency means that a modulation signal with a smaller amplitude may cause the substantial modulation in optical characteristics of the semiconductor material. However, the bandgap wavelength of the semiconductor material has substantial temperature dependence, which results in a large variation of the modulation characteristic of the optical modulator 20. The present optical module 1 mounts the optical modulator 20 on the second TEC 20 to compensate the temperature dependence of the modulation performance thereof.

Wavelength Detector

Figure 6:
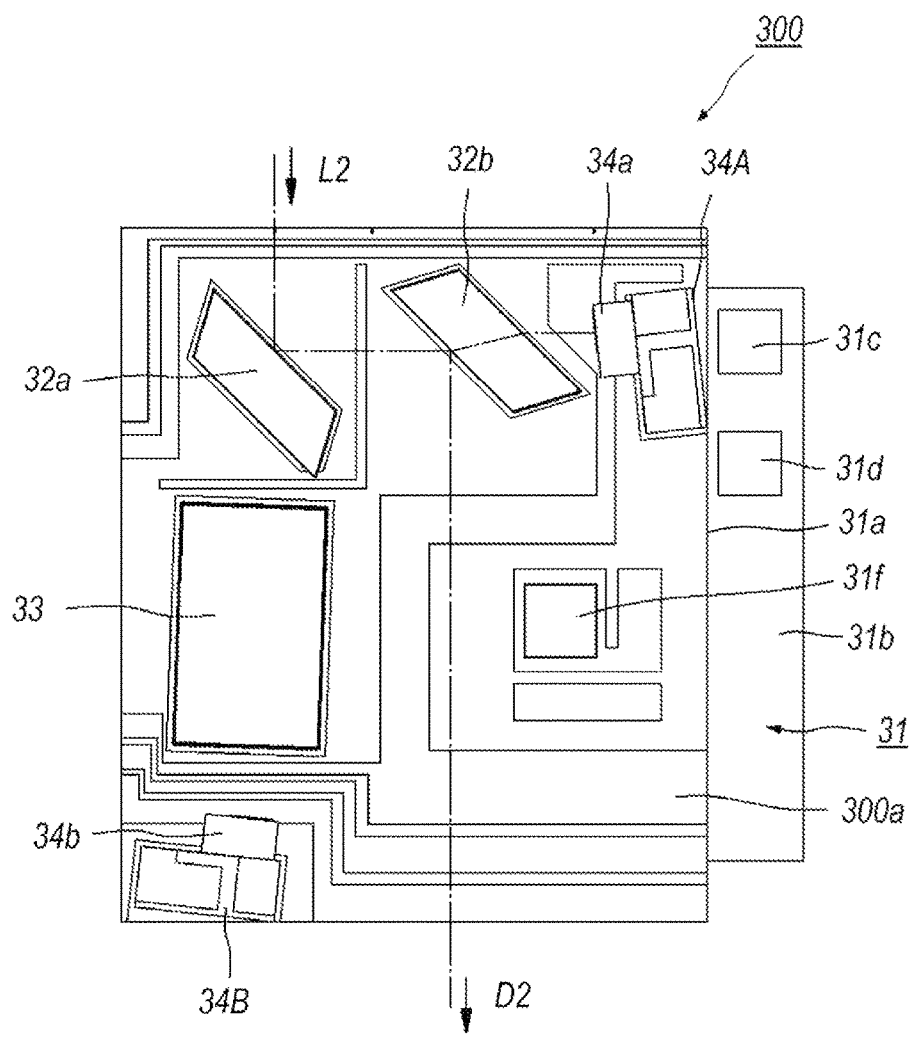
FIG. 6 is a plan view of a detector unit.

FIG. 6 is a plan view of a detector unit 300. The detector unit 300 includes a first beam splitter (BS) 32a, an etalon filter 33, a first monitor photodiode (m-PD) 34a, a second BS 32b, and a second m-PD 34b, where these components are mounted on a third TEC 31 through a carrier 300a made of AlN, where the carrier 300a will be referred as the third carrier. Two m-PDs, 34a and 34b, are mounted on the carrier 300a through respective PD sub-mounts, 34A and 34B. The third TEC 31, similar to those first and second TEC, 11 and 21, provides a top plate 31a and a bottom plate 31b. The bottom plate 31b is wider than the top plate 31a and the carrier 300a, and mounts two posts, 31c and 31d, in an area exposed from the top plate 31a and the carrier 300a in order to supply a current to Peltier elements mounted on the bottom plate 31b. The TEC 31 may compensate temperature characteristics of the etalon filter 33.

The etalon filter 33, which may be a parallel piped plate, shows a specific transmittance, in particular, periodical transmittance exhibiting strong wavelength dependence determined by a thickness of the parallel piped plate and refractive index of a material constituting the parallel piped plate.

The first BS 32a and the second BS 32b of the present detector unit 300 have a type of slab made of material substantially transparent to the second CW beam L2, typically, two BSs, 32a and 32b, may be a slab made of silica glass. The first BS 32a splits the second CW beam L2, which is output from the t-LD 10 and converted into a collimated beam by the second collimating lens 110b, into two beams. One of the split beam advances to the etalon filter 33, while, the rest of the split beam goes to the second BS 32b. The present embodiment of the detector unit 300 sets a ratio of two beams to be 5:95, that is, about 5% of the second CW beam LS enters the etalon filter 33, and the rest 95% goes to the second BS 32b. The former split beam transmitting through the etalon filter 33 enters the second m-PD 34b. The other split beam, which is bent by a right angle at the first BS 32a, goes to the second BS 32b and is split thereby into two beams. One of the split beams passing through the second BS 32b enters the first m-PD 34a, and the other beam, which is reflected in a right angle by the second BS 32b, is output from the optical module 1 as the second output D2. The split ratio of the second BS 32b is set to be also 5:95. Accordingly, the output beam D2 has the magnitude of about 90% of that of the second CW beam L2 entering the detector unit 300. The residual of the second CW beam L2 enters the first and second m-PDs, 34a and 34b, to determine the wavelength of the second CW beam L2.

The detector unit 300 may evaluate the transmittance of the etalon filter 33 by a ratio of the output of the second m-PD 34b to the output of the first m-PD 34a. Practical transmittance of the etalon filter 33 may be specified by the specification thereof, the ratio of the two outputs may determine the wavelength of the second CW beam L2 by comparing this ratio with the specification of the etalon filter 33. Moreover, controlling the biases supplied to the t-LD 10 and the temperature thereof by the first TEC 11 such that the ratio of the outputs of the two m-PDs, 32a and 32b, comes closer to the transmittance of the etalon filter 33 at a target wavelength, the emission wavelength of the t-LD 10 may coincide with the target wavelength. An etalon filter has been known as an optical device whose transmittance periodically varies against wavelengths. Accordingly, when the period of the periodic transmittance of the etalon filter matches with a span between nearest grids defined in the wavelength division multiplexing (WDM) system, which is 100, 50, and/or 25 GHz in the specification of the WDM system, the optical module 1 of the embodiment may easily set the emission wavelength to be equal to one of the grid wavelengths of the WDM system.

The temperature dependence of the periodic transmittance of the etalon filter 33 is far smaller than that of the emission wavelength of the t-LD 10. However, the present optical module 1 provides the laser unit 100 and the detector unit 300 each independently providing TECs, 11 and 31, because a temperature variation in a TEC in the laser unit slightly affects the transmittance of an etalon filter when the laser unit and the detector unit provide a common TEC.

Also, the output of the first m-PD 34a, which directly senses a portion of the second CW beam L2, namely, a portion of the optical beam not passing through the etalon filter 33, may be served for controlling the output power of the t-LD 10. That is, by feeding the output of the first m-PD 34a back to the bias, particularly, the injection current into the gain regions, 12a to 12c, in the SG-DFB 10b, the optical module 1 may control the magnitude of the second CW beam L2 in a constant level, which may be called as the automatic power control (APC) of a t-LD 10.

Modulator Unit

Figure 7:
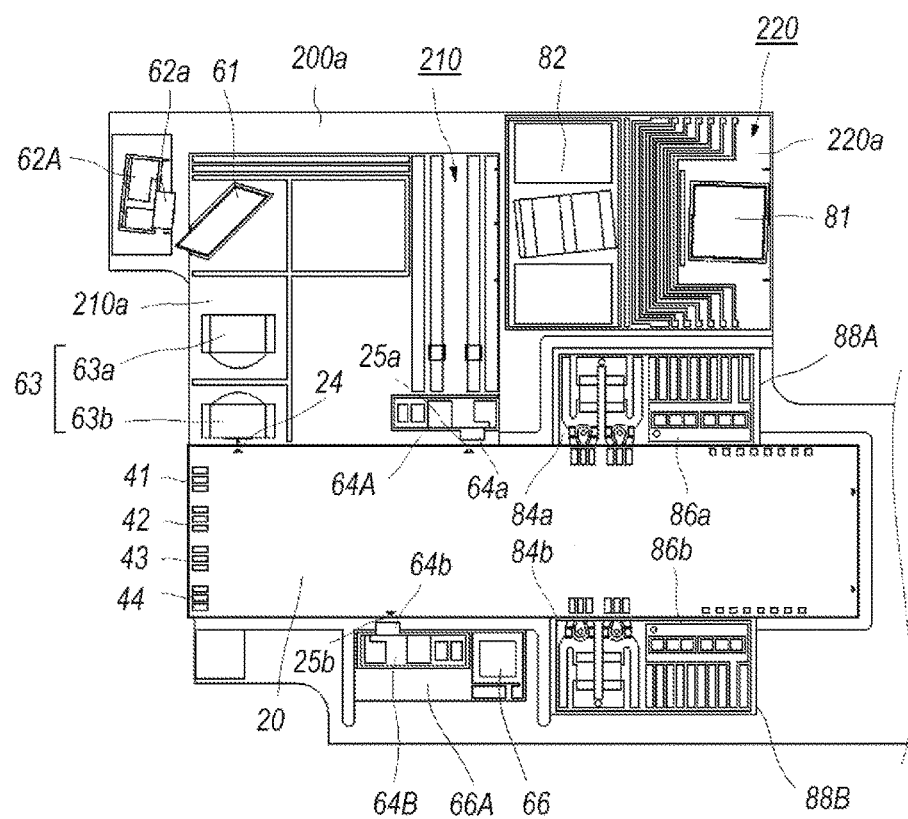
FIG. 7 is a plan view of a modulator unit.
Figure 8:
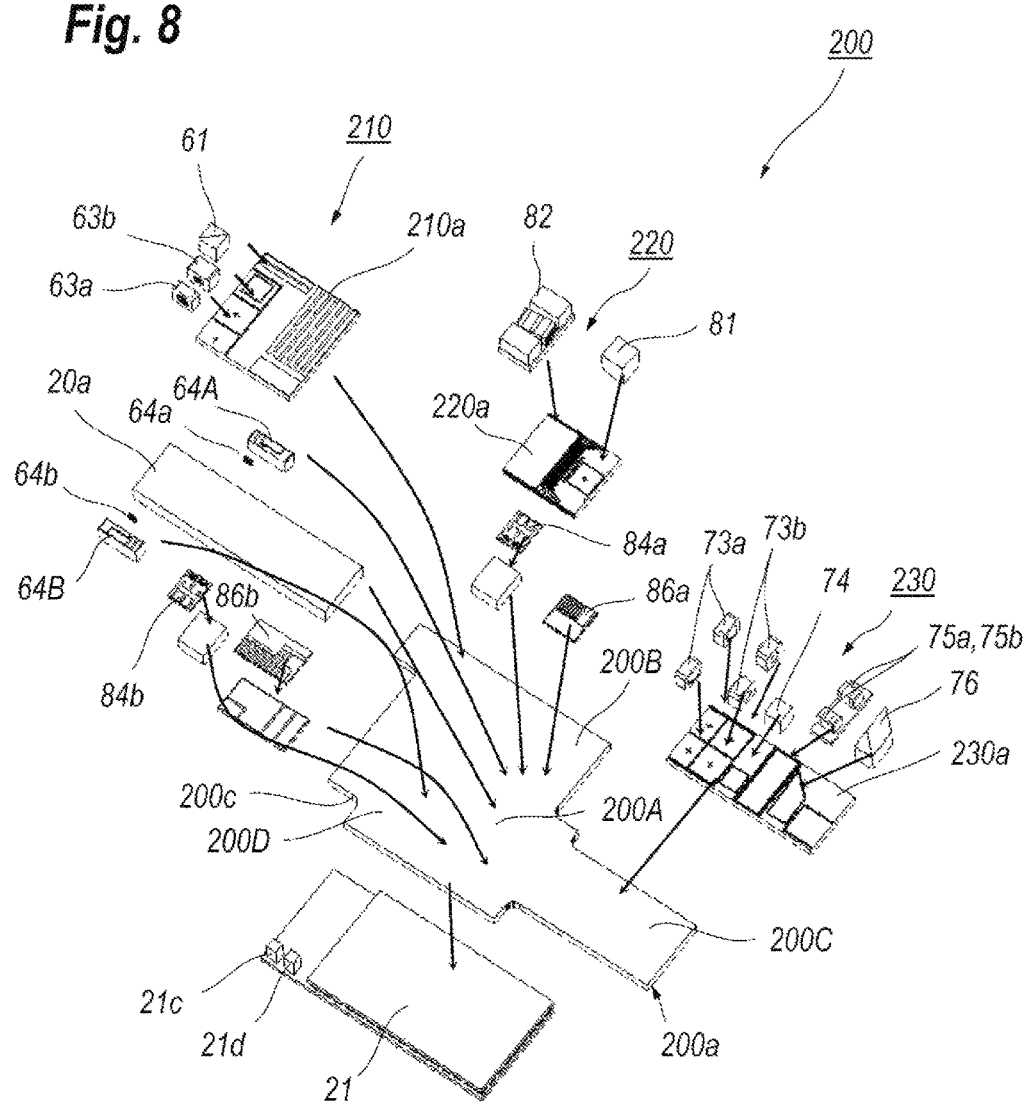
FIG. 8 is an exploded view of the modulator unit.

FIG. 7 is a plan view of a modulator unit 200, and FIG. 8 is an exploded view of the modulator unit 200. The modulator unit 200 includes an input unit 210 and a joint unit 220 each couple the first CW beam L1 output from the laser unit 100 with the optical modulator 20. The input unit 210 includes a BS 61 and a lens system 63 that are mounted on the base 200a through another carrier 210a, which will be referred as the second carrier. The joint unit 220 includes a beam shifter 81 and an optical isolator 82 on the base 200a through another carrier 220a, which will be referred as the third carrier. The first CW beam L1 output from the laser unit 100 enters the input port 24 of the optical modulator 20 after the beam shifter 81 compensates a level difference between the optical axis of the laser unit 100 and the input port 24 of the optical modulator 20, and the optical isolator 82 cuts the backward beam from the optical modulator 20 to the t-LD 10. The BS 61 may be a type of prism mirror shown in FIG. 8 or parallel plate shown in FIG. 7 each made of material substantially transparent for the first CW beam L1. The BS 61 reflects a part of the first CW beam L1, about 95% thereof, and transmits a rest 5% toward the m-PD 62a which is mounted on the base 200a through a PD sub-mount 62A.

Base

Figure 9:
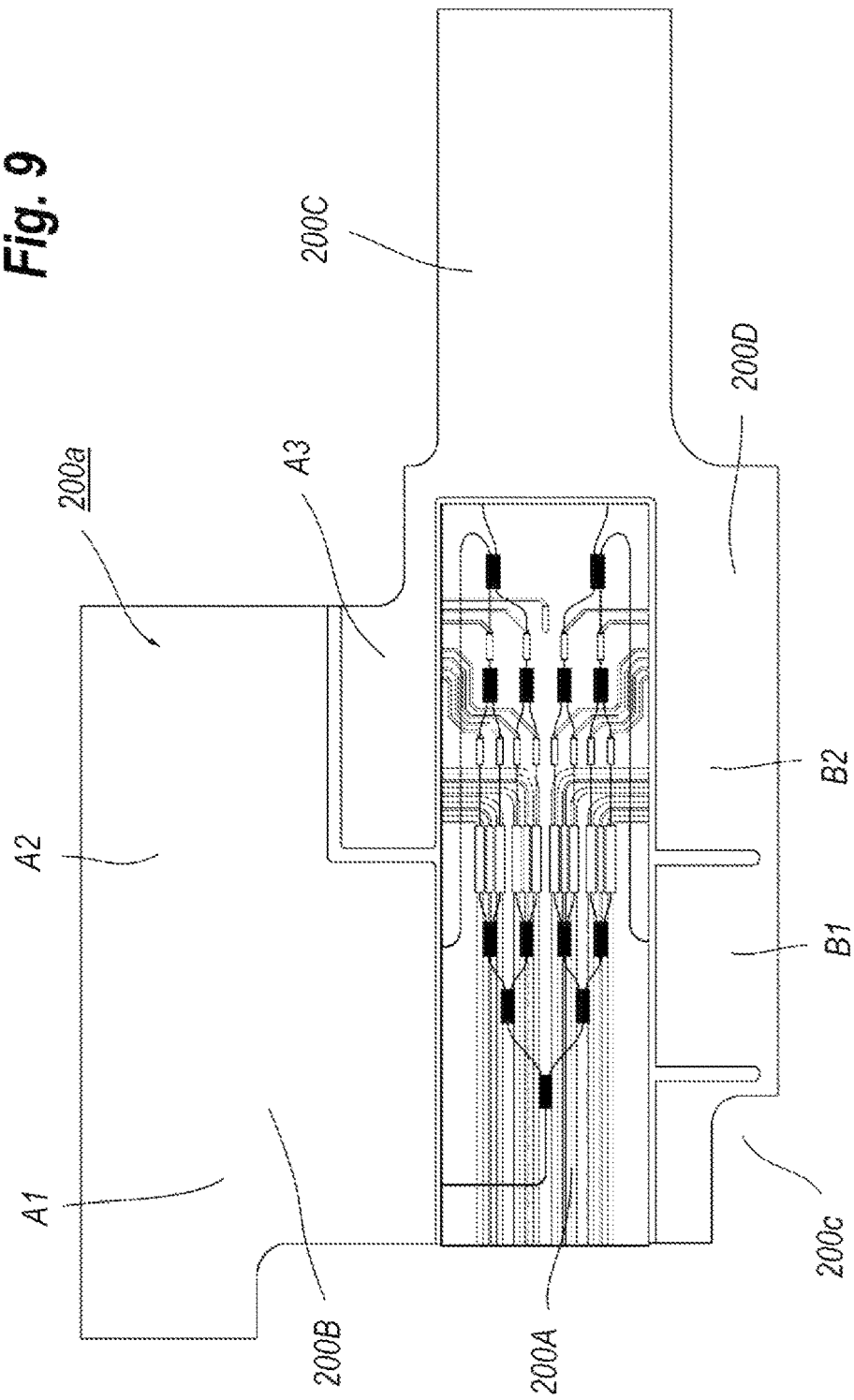
FIG. 9 is a plan view of the base of the modulator unit, where the base mounts the optical modulator through a carrier.

FIG. 9 is a plan view of the base 200a, which may be made of AlN and has an L-shape with a cut 200c in a corner between a horizontal bar and a vertical bar of the L-character. Referring to FIG. 8, the second TEC 21, similar to the aforementioned TECs, 11 and 31, has a rectangular plane shape with posts, 21c and 21d, in a corner thereof facing the rear wall 2B and the side wall 2C of the housing 2. The Peltier elements mounted on the bottom plate 21b of the second TEC 21 may be supplied with a current through the posts, 21c and 21d.

The base 200a, which has a plane shape of an L-character, is mounted on the second TEC 21 in an area closer to a corner of the L-character. The base 200a has an area greater than the area of the top plate 21a of the second TEC 21. That is, even when the base 200a is mounted on the second TEC 21, periphery portions on the base 200a are not overlapped with the top plate 21a of the second TEC 21. The base 200a provides a cut 200c in the corner of the L-character, through which two posts, 21c and 21d, of the second TEC 21 are exposed. The tops of the posts, 21c and 21d, project from the base 200a, that is, the top levels of the posts, 21c and 21d, are set higher than the primary surface of the base 200a, which enhances the productivity, or the wiring to the top of the posts, 21c and 21d.

Two areas, 200B and 200C, in the base 200a, which correspond to end portions of respective bars of the L-shape, are not overlapped with the top plate 21a of the second TEC 21. That is, the two areas, 200B and 200C, protrude from respective edges of the top plate 21a of the second TEC 21. The latter area 200C mounts the output unit 230, while, the former area 200B mounts the input unit 210 and the joint unit 220. The joint unit 220 is set forward of the input unit 210.

The base 200a has a size substantially equal to that of the optical modulator 20. That is, base 200a has a lateral width substantially equal to a lateral width of the optical modulator 20 but narrower than a lateral width of the top plate 21a of the second TEC 21. Mounting the base 200a on the top plate 21a of the second TEC 21 and the output unit 230 on the base 200a, the front edge of the second TEC 21 locates on a position of the second lens 73b in the output unit 230, where the second lens 73b is set apart from the optical modulator 20 compared with the first lens 73a. Two m-PDs, 64a and 64b, are assembled on the base 200a. The m-PD 64a is mounted on the side of a sub-mount 64A, and the m-PD 64b is mounted on the side of a sub-mount 64B. The carrier 20a is located between m-PDs, 64a and 64b and between the sides of the sub-mount 64A and the sub-mount 64B.

The m-PDs, 64a and 64b, each have optically sensitive surfaces facing the optical modulator 20 to sense the monitor signals, M2a and M2d, output from the monitor ports, 25a and 25b, of the optical modulator 20. The m-PDs, 62a and 62b, are assembled diagonally on respective sides of the optical modulator 20 corresponding to the positions of the monitor ports, 25a and 25b.

Terminator Unit

Figure 10:
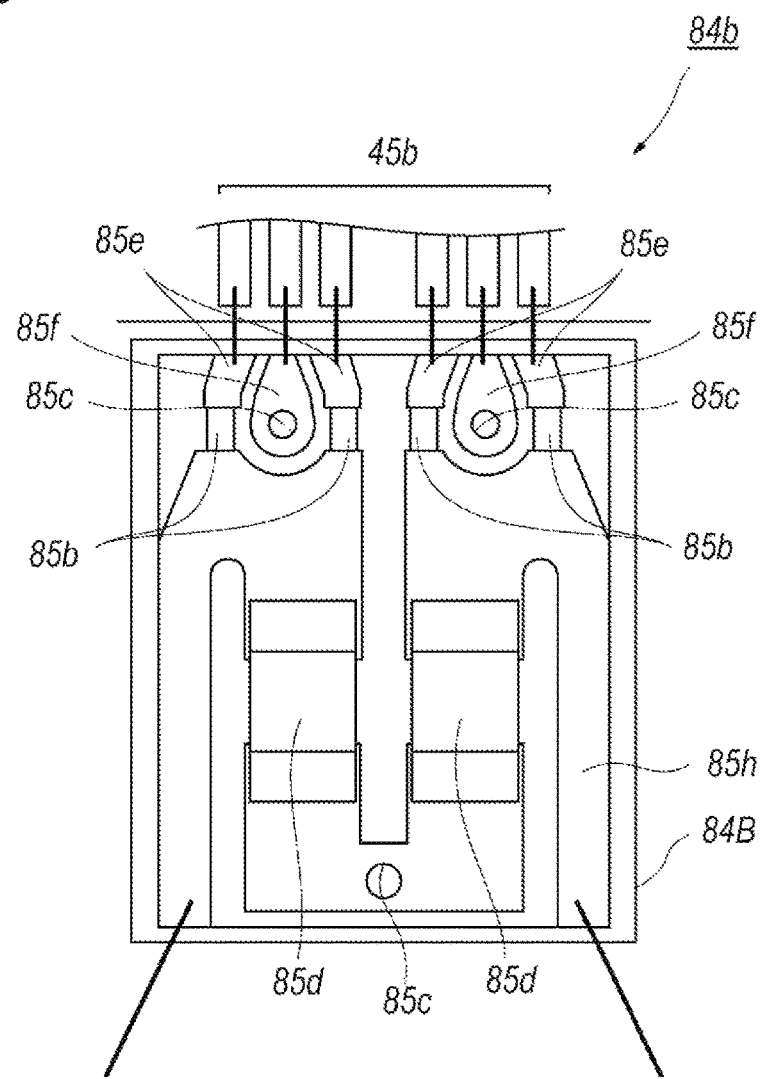
FIG. 10 is a plan view of a terminator unit mounted on the base shown in FIG. 9.

The terminator units, 84a and 84b, are arranged in front sides of the m-PDs, 64a and 64b, so as to put the optical modulator 20 therebetween. FIG. 10 is a plan view of one of the terminator units 84b, and the terminator units 84a has the same arrangement with those shown in FIG. 10. The terminator unit 84a includes terminators 85b, via-holes 85c, and die-capacitors 85d on a terminator carrier 84B made of ceramics, typically, alumina ($Al_2O_3$). The terminator 85b is a type of thin film resistor formed on the ceramic carrier 84B with resistance of 100Ω. The terminator 85b may terminate the interconnections 45b in the optical modulator 20 that transmit modulation signals to the MZ elements, 51M to 54M. The interconnections 45b shown in FIG. 10 is divided into two groups each having three interconnections and corresponding to two MZ elements, 53M and 54M. Respective center interconnections in the respective groups are wired to the ground pad 85f and the respective two interconnections are wired to the signal pads 85e.

The ceramic carrier 84B in a top surface thereof provides interconnections 85h, while, a whole back surface thereof provides the ground pattern. The ground pad 85f provides a via-hole 85c in a center thereof and connected to the ground pattern of the back surface of the ceramic carrier 84B. Interconnections 85h connected to the respective terminators 85b are connected to the ground pattern in the back surface of the carrier 84B through respective die-capacitors 85d and the via-hole 85c. The interconnecting 85h common to respective terminators 85b may be externally biased. Thus, the interconnections 45b in the optical modulator 20 may be terminated in the AC mode through the terminators 85b as biased in the DC mode through the interconnections 85h. The terminator units, 84a and 84b, are mounted on the base 200a through respective carriers, 88A and 88B, provided commonly to the bias units, 86a and 86b.

Bias Unit

Figure 11:
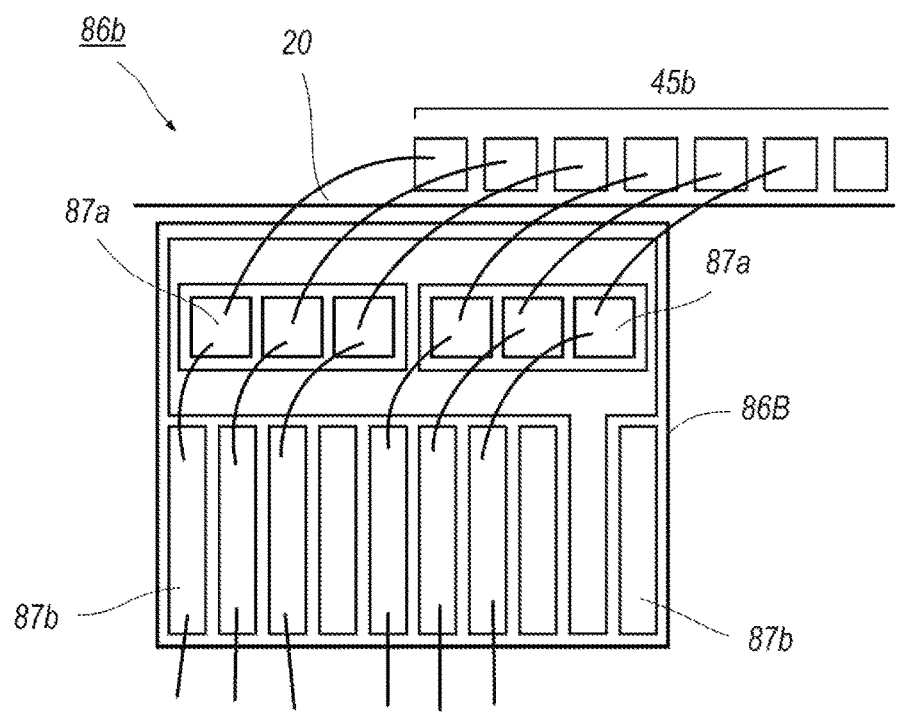
FIG. 11 is a plan view of a bias unit mounted on the base shown in FIG. 9.

Two bias units, 86a and 86b, are arranged in side by side to the terminator units, 84a and 84b, on the common carriers, 88A and 88B, and sandwiches the optical modulator 20 therebetween. FIG. 11 is a plan view showing one of the bias units 86b, but the other of the bias units 86a has the same arrangement with those shown in FIG. 11. The optical modulator 20 provides two offset electrodes, 51j and 51k, for the X-polarization and the 0° signal, those, 52j and 52k, for the X-polarization and 90° signal, those, 53j and 53k, for the Y-polarization and 0° signal, and those, 54j and 54k, for the Y-polarization and 90° signal. In addition, the optical modulator 20 further provides the quadrature electrodes, 51c and 52c, for the X-polarization and those, 53c and 54c, for the Y-polarization. Thus, the optical modulator 20 is necessary to be supplied with twelve (12) biases. One of the bias units 86a provides 6 biases for the X-polarization and the other of the bias units 86b supplies 6 biases for the Y-polarization.

The bias unit 86b, as shown in FIG. 11, provides six (6) die-capacitors 87a and some interconnections 87b. The six biases are supplied to respective electrodes 45b in the optical modulator 20 through the interconnections 87b and the die-capacitors 87a. Some of the interconnections 87b are served for grounding the back surfaces of the die-capacitors 87a.

Input Unit

Figure 12:
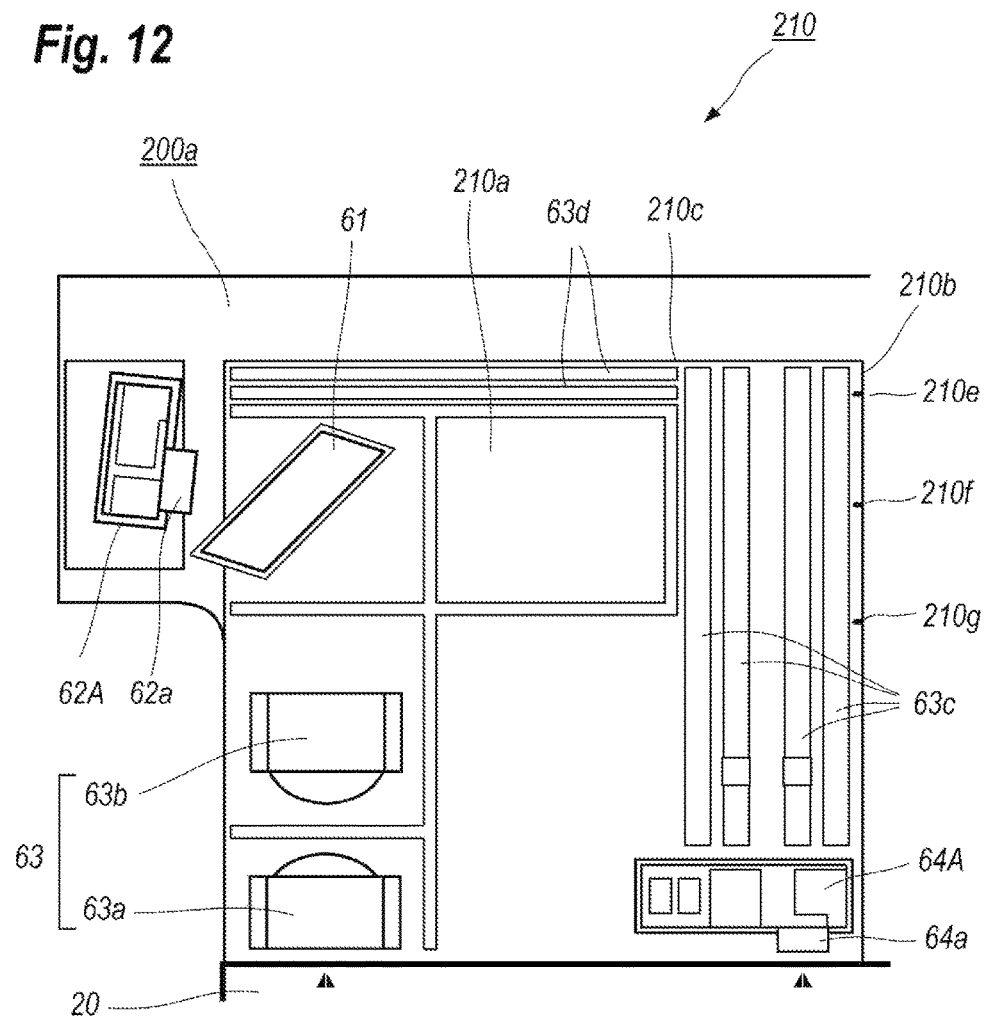
FIG. 12 is a plan view of an input unit to guide the first CW light emitted from the laser unit shown in FIG. 4 into the optical modulator shown in FIG. 2.

FIG. 12 is a plan view of the input unit 210. The input unit 210 is mounted on the base 200a in a portion 200D, which extends from a center portion 200A thereof, through a carrier 210a made of AlN, which will be referred as the second carrier. That is, the input unit 210 positions on the base 200a in an end of the vertical bar of the L-character.

The input unit 210 includes, in addition to the carrier 210a, the input lens system 63 including the first lens 63a and the second lens 63b, and a beam splitter (BS) 61. The first CW beam L1 generated in the laser unit 100 is bent by a right angle by the BS 61 to couple the input port 24 of the optical modulator 20 through the input lens system 63.

The input unit 210, as described above, has the two-lens system 63 including the first lens 63a closer to the optical modulator 20 and the second lens 63b.

Figure 13A:
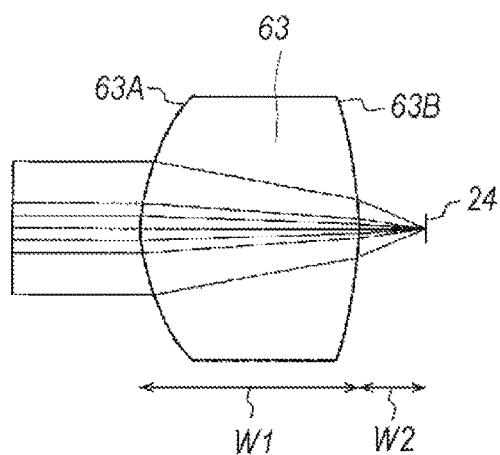
FIG. 13A schematically shows a ray tracing of the one lens system.
Figure 13B:
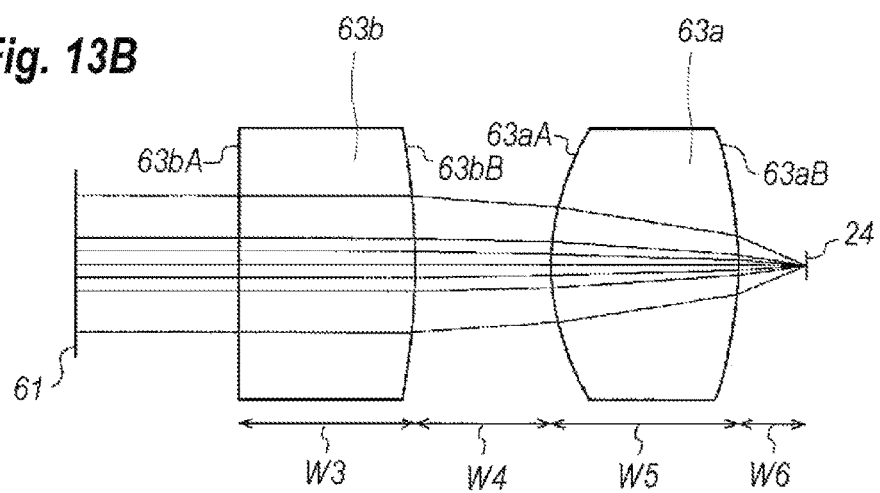
FIG. 13B shows a ray tracing of the two lens system.

FIG. 13A and FIG. 13B compare the two-lens system (FIG. 13B) with a conventional one-lens system (FIG. 13A). The one-lens system of FIG. 13A and the two-lens system of FIG. 13B both assume the aspheric lenses in which a curvature of the optical beam incoming surface is different from a curvature of the optical beam outgoing surface. Specifically, the one lens system assumes an aspheric lens 63 with an optical beam incoming surface and an optical beam outgoing surface both having spherical surfaces but the curvatures thereof are different from each other, while, the first lens 63a in the two-lens system shown in FIG. 13B has an arrangement similar to that of the lens 63 in the one-lens system but the second lens 63b in the two-lens system has a plane surface for the incoming optical beam.

Also, the first lens 63a in the two-lens system has a thickness different from the lens 63 in the one-lens system. For instance, the lens 63 in FIG. 13A has a thickness W1 of 0.84 mm, but the first lens 63a and the second lens 63b in FIG. 13B have thicknesses, W5 and W3, of 0.7 mm and 0.65 mm, respectively. A distance W2 from the beam outgoing surface 63B of the lens 63 to the input port 24 is set to be 0.25 mm or a distance W6 from the beam outgoing surface 63aB to the input port 24 is also 0.25 mm. The distance W4 from the beam outgoing surface 63bB of the second lens 63b to the beam incoming surface 63aA in FIG. 13B is 0.5 mm. For such lens systems, focal lengths at which the optical coupling efficiency of the CW beams to the input port 24 of the optical modulator become 645 µm.

Figure 14A:
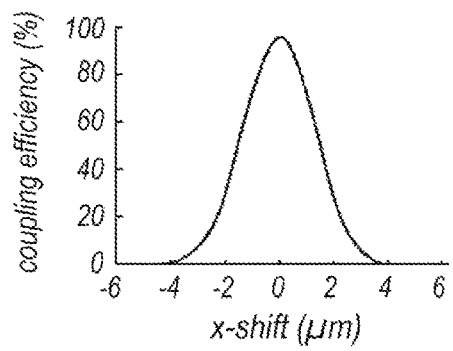
FIG. 14A to FIG. 14F show coupling tolerances of the one lens system (FIGS. 14A and 14B), coupling tolerances of the first lens in the two-lens system (FIGS. 14C and 14D), and coupling tolerances of the second lens in the two-lens system (FIG. 14E and FIG. 14F)
Figure 14B:
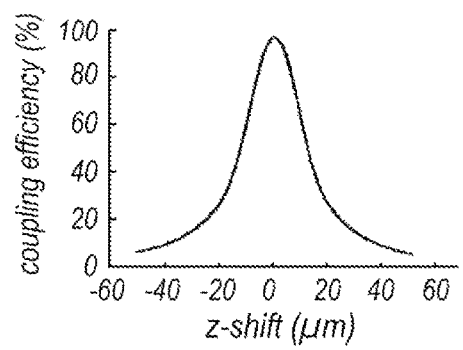
Figure 14C:
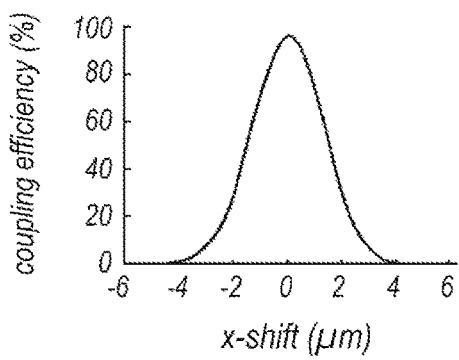
Figure 14D:
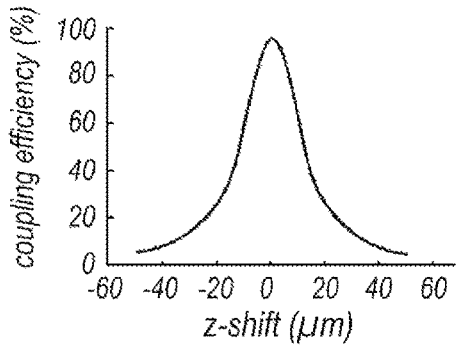
Figure 14E:
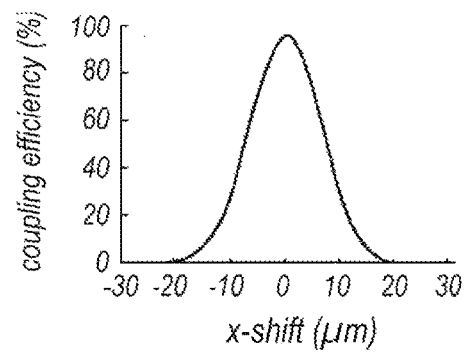
Figure 14F:
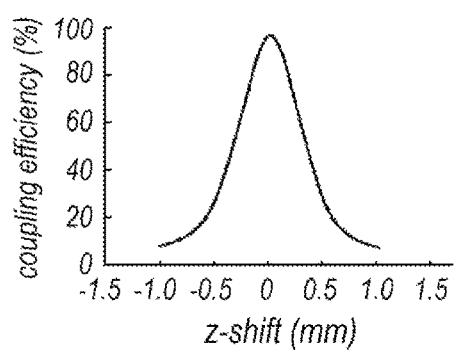

FIG. 14A to FIG. 14F show alignment tolerances of the lens in the one-lens system and those in the two-lens system, where vertical scales are normalized with respect to the maximum coupling efficiency. FIG. 14A shows a coupling tolerance of the lens 63 in the one-lens system for a deviation from the position at which the maximum coupling efficiency is obtained, along the x-direction, namely perpendicular to the optical axis of the lens. FIG. 14B also shows a coupling tolerance of the lens 63 for the deviation from the position along the optical axis, z-direction. FIG. 14C and FIG. 14D show the tolerances of the coupling efficiency of the first lens 63a in the two-lens system along the x- and z-directions, and FIGS. 14E and 14F also show the coupling tolerances for the second lens 63b in the two-lens system along the x- and z-directions.

The lenses, 63, 63a and 63b, are fixed at respective positions where the maximum coupling efficiency against the input port 24 is realized by adhesive material typically ultraviolet curable resin. However, solidification of such resin inevitably shrinks through curing, which causes positional deviations of the lenses and degrades the coupling efficiency. Assuming that 20% reduction in the coupling efficiency is acceptable, the lens 63 in the one-lens system and the first lens 63a in the two-lens system show tolerances along the x-direction of 1.04 and 0.97 µm, respectively. These values are comparable to the shrinkage of the adhesive resin. Accordingly, in the one-lens system, even the lens 63 is aligned in the position at which the maximum coupling efficiency is realized, this maximum coupling efficiency may not secured after the solidification of the adhesive resin, and, no means are left to compensate the degraded coupling efficiency.

On the other hand, the second lens 63b in the two-lens system shows the alignment tolerances far greater than those of the lens 63 in the one-lens system and the first lens 63a. In particular, the second lens 63b shows a large tolerance, about two figures greater than that of the first lens 63a, along the z-direction. Even when the second lens 63b deviates from the designed position by 230 µm, the degradation of the coupling efficiency may be set within −0.5 dB. For the tolerance along the x-direction, the second lens 63b shows a greater tolerance, several times greater than that of the first lens 63a, and that of the lens 63 in the one-lens system. Accordingly, the two-lens system may securely recover or compensate by the second lens 63b the coupling efficiency degraded by the shrinkage of the adhesive resin for the first lens 63a. The adhesive resin for the second lens 63b also shrinks during the solidification thereof. However, the shrinkage with the second lens 63b is negligibly smaller compared with the large positional tolerance acceptable for the second lens 63b.

The carrier 210a further mounts the m-PD 64 via the PD sub-mount 64A, four interconnections 63c along a side 210b facing the joint unit 220 to carry the sensed signals output from the m-PDs, 64a and 64b, other two interconnections 63d along one side 210c to carry another sensed signal output from the m-PD 62a. Two of the four interconnections 63c are for the first m-PD 64a, and the other two interconnections 63c are for the second m-PD 64b mounted in another side of the optical modulator 20. Wiring from the PD sub-mount 64B for the m-PD 64b in the other side to the PD sub-mount 64A across the optical modulator 20 and further wiring the PD sub-mount 64A to the interconnections 63c, the sensed signal output from the m-PD 64b may be carried to the DC terminals 5a in the side wall 2C. The m-PD 62a mounted behind the BS 61 may sense the magnitude of the first CW beam L1 entering the optical modulator 20. The BS 61 splits the CW beam L1 by a ratio of 5:95, that is, 5% of the CW beam L1 passes the BS 61, and the rest 95% thereof is reflected by the BS 61 toward the lens system 63. The sensed signal output from the m-PD 62 may be carried on the interconnections 63d provided along the side 210c of the carrier 210a, and wire-bonded to the DC terminals 5a in the side wall 2C. Feeding the sensed signal of the m-PD 62a to the bias supplied to the SOA 10a in the t-LD 10, the first CW beam L1 entering the optical modulator 20 may be kept in the magnitude thereof in constant. The arrangement of the wirings thus described may enable the sensed signals output from the m-PDs, 62a to 64b, to be extracted from the DC terminals 5a in one side wall 2C, even when the m-PD 62b is placed in the side of the other side wall 2D. Moreover, the interconnections 63c on the carrier 210a may not interfere with the optical axis of the first CW beam L1 connecting the laser unit 100 to the BS 61.

Joint Unit

FIG. 15 is a plan view of the joint unit 220. The joint unit 220, similar to the input unit 210, provides a carrier 220a with a rectangular shape, which will be referred as the third carrier, is mounted on the area 200B of the base 200a and upstream the input unit 210 closer to the laser unit 100, where the area 200B extends from the center area 200A overlapping with the top plate 21a of the second TEC 21. The joint unit 220 includes a beam shifter 81, an optical isolator 82, and some interconnections 220d on the top surface of the carrier 220a. The interconnections 220d are wired between the beam shifter 81 and the optical isolator 82.

The beam shifter 81 compensates a vertical discrepancy between the optical axis of the laser unit 100 and the input port 24 of the optical modulator 20. The laser unit 100 and the modulator unit 200 are mounted on respective TECs, 11 and 21, independent to each other. This arrangement often cause an offset between the optical axes of components in the laser unit 100 and those in the modulator unit 200 within a range of allowable tolerances in physical dimensions of those components. Also, even in the modulator unit 200, the coupling unit 220, the input unit 210, and the optical modulator 20 are mounted on the base 200a via respective carriers, 20a, 210a, and 220a, independent to each other. Accordingly, vertical discrepancies between optical axes of components, namely, the optical isolator 82, the BS 61, the lens system 63, and the optical modulator 20 are often encountered. Adhesive resin to fix the BS 61 and the lens system 63 on the carrier 210a may adjust the vertical discrepancies of the optical axes. However, when the offset between the optical axes of the laser unit 100 and the input port 24 of the optical modulator 20 becomes large, or exceeds an allowable limit, the resin in thicknesses thereof may not compensate those discrepancies in the optical axes. The lens system 63 is impossible to lower the top level of the carrier 210a, and thicker adhesive resin for the lens system 63 may degrade the reliability of the fixation.

The beam shifter 81 of the embodiment may compensate the offset between the optical axis of the laser unit 100 and that of the optical modulator 20. The beam shifter 81 is a rectangular block with a beam incoming surface and a beam outgoing surface extending in parallel to each other and made of material transparent to the first CW beam L1. Setting the beam shifter 81 on the carrier 220a as vertically inclining against the top surface of the carrier 220a, the optical axis of the first CW beam L1 may translate vertically. The beam shifter 81 is also set on the carrier 220a inclined horizontally so as to prevent the first CW beam L1 back to the laser unit 100.

The interconnections 220d are wired between the beam shifter 81 and the optical isolator 82 between one side facing the terminator unit 84a and the bias unit 86a to another side facing the side wall 2C so as to avoid the beam shifter 81. Similar to the interconnections 63c on the input unit 210, the interconnections 220d on the joint unit 220 may not interfere with the optical axis of the first CW beam L1. The terminator unit 84a and the bias unit 86a are electrically connected to the DC terminals 5a in the side wall 2C through the interconnections 220d. Although the interconnections 220d shown in FIG. 15 avoid the beam shifter 81, the interconnections 220d may intersect the beam shifter 81, that is, the interconnections 220d may run beneath the beam shifter 81. Because signals are carried on the interconnections 220d substantially in the DC mode, the quality of those signals is not affected by an environment of the wiring.

Output Unit

Figure 16:
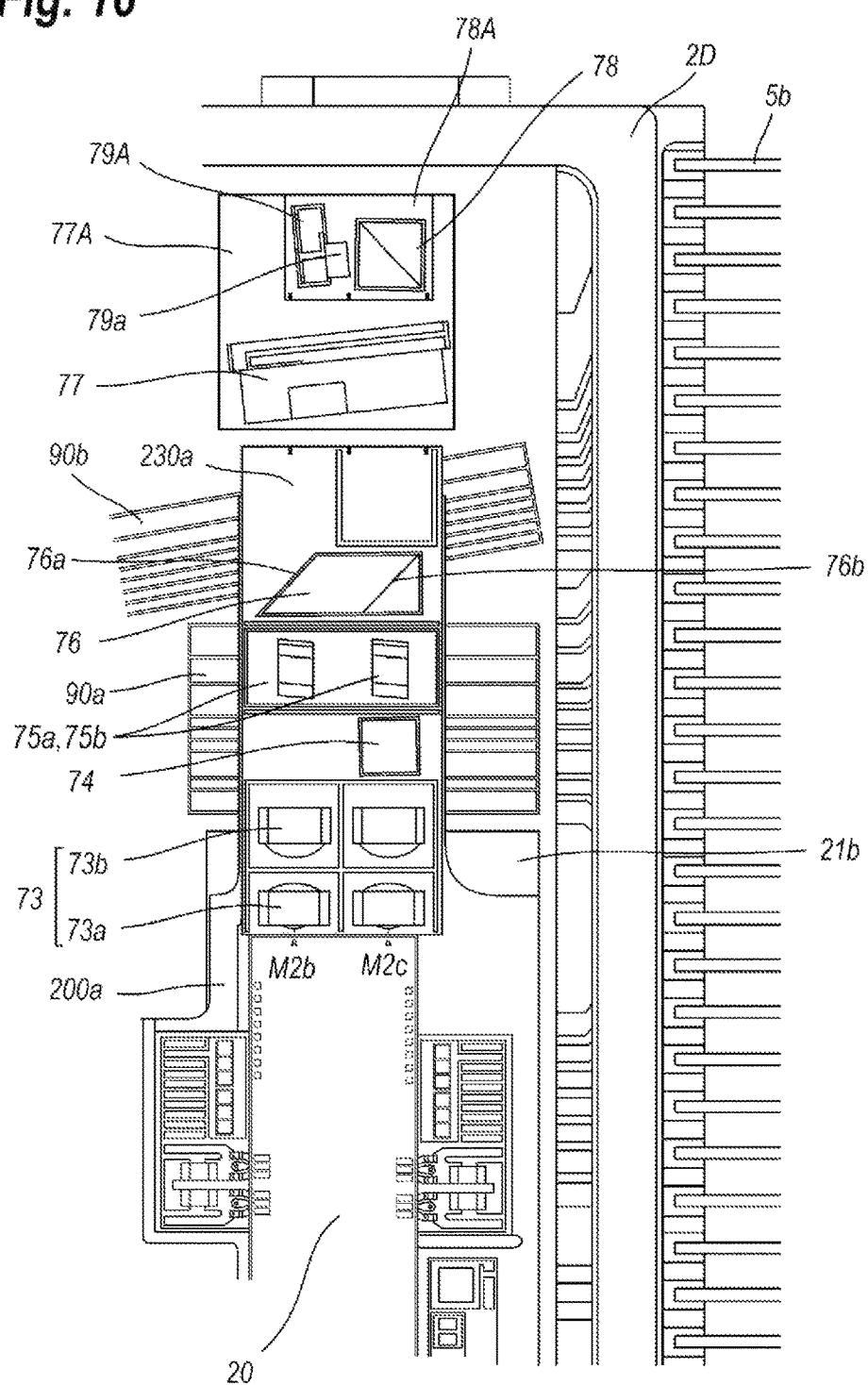
FIG. 16 is a plan view of an output unit.

FIG. 16 is a plan view of the output unit 230. The output unit 230 includes the output lens system 73 comprising two first lenses 73a and two second lenses 73b. The output lens system 73 converts two modulated beams, M2b and M2c, output from the optical modulator 20 into collimated beams, multiplexes the collimated two beams, and outputs the multiplexed beam to the first output port 3a as the output beam D1. The output unit 230 further includes a skew adjuster 74, two optical isolators, 75a and 75b, a polarization beam combiner (PBC) unit 76, and a variable optical attenuator (VOA) 77. The skew adjuster 74 may compensate a difference of optical paths from the optical modulator 20 to the PBC unit 76 for the respective modulated beams, M2b and M2c. The PBC unit 76 includes a reflector 76a and a PBC element each made of multi-layered optical films.

One of the output lens systems 73 collimates the modulated beam M2c toward the first output port 3a, while, the other of the output lens systems 73 also collimates the other modulated beam M2b toward the mirror 76a in the PBC unit 76. The output lens systems 73 each include the first lens 73a set closer to the optical modulator 20 and the second lens 73b set closer to the PBC unit 76. The two modulated beams, M2b and M2c, are each collimated by the respective lens system 73.

One of the modulated beams M2c is collimated by the output lens system 73 and enters the PBC unit 76 as passing through the skew adjuster 74 and the optical isolator 75b. The other modulated beam M2b is also collimated by the output lens system 73 and enters the PBC unit 76 as passing through the optical isolator 75a. The skew adjuster 74 may compensate the optical path difference of the two modulated beams, M2b and M2c. That is, the modulated beam M2b comes the PBC element 76b running on an extra path from the mirror 76a to the PBC element 76b compared with the other modulator beam M2c that directly comes straight to the PBC element 76b from the optical modulator 20. The skew adjuster 74, by being set intermediate of the optical path for the modulated beam M2c, may compensate the optical length of this extra path. The skew adjuster 74 of the embodiment may be a block made of material transparent for the first CW beam, silicon (Si) in the present embodiment, and set slightly inclined with respect to the optical axis of the modulated beam M2c to prevent the optical beam reflected thereby from coming back to the optical modulator 20.

The modulated beams, M2b and M2c, inherently have the polarization reflecting that of the first CW beam entering the optical modulator L1, because the optical modulator 20 includes no components to rotate the polarization of the incident beam. Accordingly, two modulated beams, M2b and M2c, have the polarization identical to each other. Two optical isolators, 75a and 75b, may rotate the polarization of the incident beams, M2b and M2c, independently, that is, the optical isolators, 75a and 75b, may set a difference of 90° in the polarization between two outgoing beams. For instance, setting a half-wave plate ($\lambda/2$-plate), which may rotate the polarization of incident beam by 90°, only in one of the optical isolates, two modulated beams, M2b and M2c, output from the optical isolators, 75a and 75b, may show the polarization status different by 90° to each other. The modulated beams, M2b and M2c, enter the PBC element 76b as maintaining the polarization status thereof.

The PBC element 76b includes multi-layered optical films and shows a peculiar property depending on the polarization of the incoming beam. For instance, the PBC element 76b may show large reflectance, equivalently small transmittance, for the incident beam having the polarization within the incident plane while large transmittance, equivalently small reflectance, for the incident beam with the polarization perpendicular to the incident plane, where the incident plane may be formed by the optical axis of the incident beam and the normal of the incident surface of the PBC element 76b. Setting the polarization direction of the modulated beam M2c in perpendicular to the incident plane for the PBC element 76b, but that of the other modulated beam M2b in parallel to the incident plane, the former modulated beam M2c in almost all portion thereof may transmit the PBC element 76b, and the latter modulated beam M2b in almost all portion thereof may be reflected by the PBC element 76b. Thus, the two modulated beams, M2b and M2c, may be effectively multiplexed, e.g., polarization-multiplexed, by the PBC element 76b by rotating the polarization of one of the modulated beam M2b by 90° by the optical isolator 75a. The PBC unit 76 outputs thus multiplexed beam to the VOA 77.

The two optical isolators, 75a and 75b, are the type of polarization dependent isolator. By setting a magnet, not shown in figures, for inducing magnetic fields commonly to the isolators, 75a and 75b, the embodiment is implemented with the integrated optical isolator 75. Moreover, the description above concentrates on an arrangement where only the optical isolator 75a provides the λ/2-plate in the output thereof. However, an alternative may be applicable where one of the optical isolators 75a sets the crystallographic axis thereof in −22.5° but the other isolator 75b sets the crystallographic axis in 22.5° with respect to the polarization direction of the modulated beams, M2b and M2c. Then, the modulated beams, M2b and M2c, output from respective optical isolators, 75a and 75b, have the respective polarization directions thereof perpendicular to each other.

Thus, the arrangement, where two first lenses 73a and two second lenses 73b, the skew adjuster 74, the optical isolator 75, and the PBC unit 76, are mounted on the base 200a via the carrier 230a made of AlN, which will be referred as the fourth carrier, may simplify the optical alignment for those components with respect to the modulated beams, M2b and M2c, output from the optical modulator 20. Because those optical components on the carrier 230a inherently have dull temperature characteristics, it is unnecessary to control temperatures of those components by the second TEC 21 in the modulator unit 200. Accordingly, the area 200C of the base 200a, where the carrier 230a is mounted, is overhung from the area 200A overlapping with the top plate 21a of the TEC 20 and leaves a wide space under the carrier 230a. The first optical module 1 of the present invention installs two wiring substrates, 90a and 90b, to carry signals from the DC terminals 5b in the side wall 2D of the housing 2 to the laser unit 100 installed in the side of the other side wall 2C.

The reason to set the VOA 77 downstream the PBC unit is, when the optical module 1 is installed within an optical transceiver having functions to transmit an optical signal and to receiver another optical signal concurrently, a situation is probably encountered where only the function of the signal transmission is killed as leaving the function of the signal reception. In such a case, only the second output D2 of the optical module 1 is required. When the biases supplied to the t-LD 10 is cut to stop the operation thereof, the second output D2 also disappears. The VOA 77 set in the path for the first optical output D1 may interrupt the operation only of the signal transmission.

When a VOA is set in upstream of the optical modulator 20, the function to stop the signal transmission may be realized. However, this arrangement fully suspends the input of the first CW beam L1 to the optical modulator 20. The optical modulator 20 is necessary to adjust the biases supplied to the offset electrodes and the quadrature electrodes using the first CW beam L1 to adjust the phases of two optical outputs, M2b and M2c. Such adjustments may be carried out for the modulated signals, M2a and M2d, output from the monitor ports, 25a and 25b, even when the modulated beams, M2b and M2c, are suspended.

The optical module 1 sets the m-PD 79a in downstream of the VOA 77. The m-PD 79a, which is mounted in a side of the PD sub-mount 79A, senses a portion of the optical output D1 split by the BS 78. The m-PD 79a, the PD sub-mount 79A, and the BS 78 are mounted on the VOA carrier 77A, which is placed on the bottom of the housing 2 independent of the carrier 230a. The output of the m-PD 79a is used for detecting the degradation of elements integrated within the optical modulator 20 and the excessive output power of the optical module 1.

As shown in FIG. 16, the output unit 230 is also implemented with the two-lens system 73 for respective modulated beams, M2b and M2c. The field pattern of the modulated beams, M2b and M2c, is usually deviated from a true round reflecting the cross section of the waveguide in the optical modulator 20. Such a distorted beam usually degrades the coupling efficiency against an optical fiber with a circular field pattern. The two-lens system of the present optical module 1 may suppress the reduction of the coupling efficiency between the optical beam with a distorted filed pattern and an optical medium with a circular cross section. In an alternative, the optical module 1 may set a beam shaper downstream the PBC unit 76 to modify the field pattern of the output beam D1.

Figure 17:
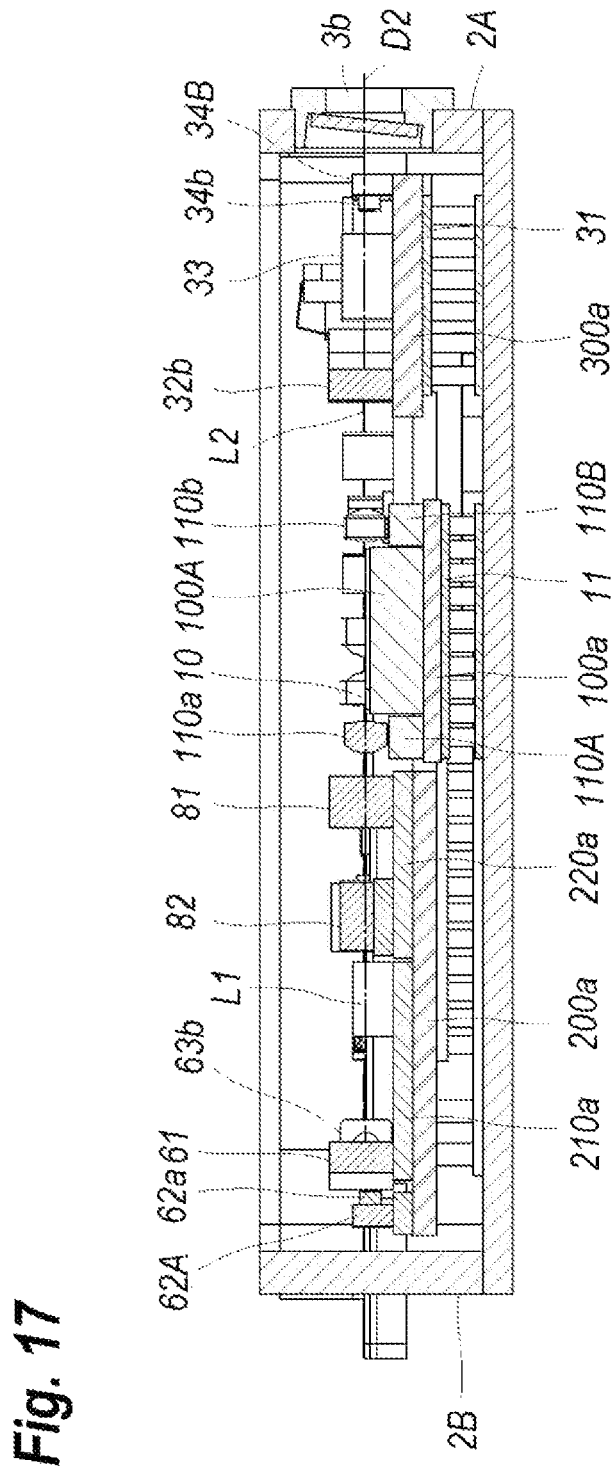
FIG. 17 shows a cross section of the optical module taken along the optical axis extended from the second output port.

FIG. 17 shows a cross section of the optical module 1, which is taken along the optical axes of the first CW beam L1 and the second CW beam L2. Referring to FIG. 17, the carrier 220a of the joint unit 220 does not interfere with the optical axis of the first CW beam L1 coming from the t-LD 10 to the BS 61. Referring to FIG. 15, the joint unit 220 provides the interconnections 220d that carries the biases from the DC terminals 5a in the side wall 2C to the pads 46a on the optical modulator 20 connected to the offset electrodes, 51j to 52k, and the quadrature electrodes, 51c and 52c. When the pads 46a are directly wire-bonded to the DC terminals 5c, not only the bonding wires lengthen but sometimes interrupt the optical axis of the first CW beam L1. The optical module 1 of the embodiment avoids the optical axis by the interconnections 220d on the joint unit 220a. That is, the pads 46a on the optical modulator 20 are first wired to the ends of the interconnections 220d, and further wired in the other ends thereof to the DC terminals 5a. Thus, the optical axis of the first CW beam L1 does not interfere with members except for the beam shifter 81 and the optical isolator 82.

Also, the carrier 210a of the input unit 210 mounts the m-PD 64a via the PD sub-mount 64A. The m-PD 64a optically couples with the monitor port 25a. The biases supplied to the offset electrodes, 51j to 52k, and the quadrature electrodes, 51c and 52c may be determined based on the output of the m-PD 64a. The interconnections 63c on the carrier 210a that carries the output of the m-PD 64a to the DC terminal 5a also does not interfere with the optical axis of the first CW beam L1.

The area A3 of the base 200a mounts the terminator unit 84a in addition to the bias unit 86a. The terminator unit 84a provides four terminators 85b and two capacitors 85d. The terminators 85b terminate the interconnections, 41 and 42, carrying the modulation signals to the MZ elements, 51M and 52M. The modulation signals provided to the respective MZ elements, 51M to 54M, have magnitudes of about 1 Vp-p. The terminators 85b with impedance of 50Ω for such modulation signals each consume the power of 20 mW. Accordingly, the optical modulator 20 of the embodiment sets the terminators externally to suppress the power consumption thereof. However, bonding wires from the optical modulator 20 to the terminators 85b are necessary to be short as possible, the terminator units, 84a and 84b, are set immediate to the optical modulator 20.

The area B1 of the base 200a mounts the other m-PD 64b via the PD sub-mount 64B for the MZ elements, 53M and 54M, and the area B2 mounts the other terminator unit 84b and the other bias unit 86b, where the arrangements of those units, 84b and 86b, are same with those aforementioned units, 84a and 86a.

As described, the optical modulator 20 is mounted on the base 200a, and the base 200a is mounted on the top plate 21a of the second TEC 21. An optical modulator like the present embodiment inherently shows dull temperature dependence of characteristics thereof. However, the optical coupling between the optical modulator 20, the input unit 210, the joint unit 220, and the output unit 230 may be varied depending on the temperature, which is generally called as the tracking error. Accordingly, the present optical module 1 mounts those units, 210, 220, and 230, commonly on the base 200*a*, and the base 200*a* is set on the second TEC 21 to suppress the tracking error. However, the temperature dependence of the optical coupling of those units, 210, 220, and 230, are far smaller than that of the t-LD 10. Accordingly, the base 200*a* of the present embodiment mounts those units, 210, 220, and 230 on the areas, 200B and 200C, not overlapping with the TEC 21.

Figure 18:
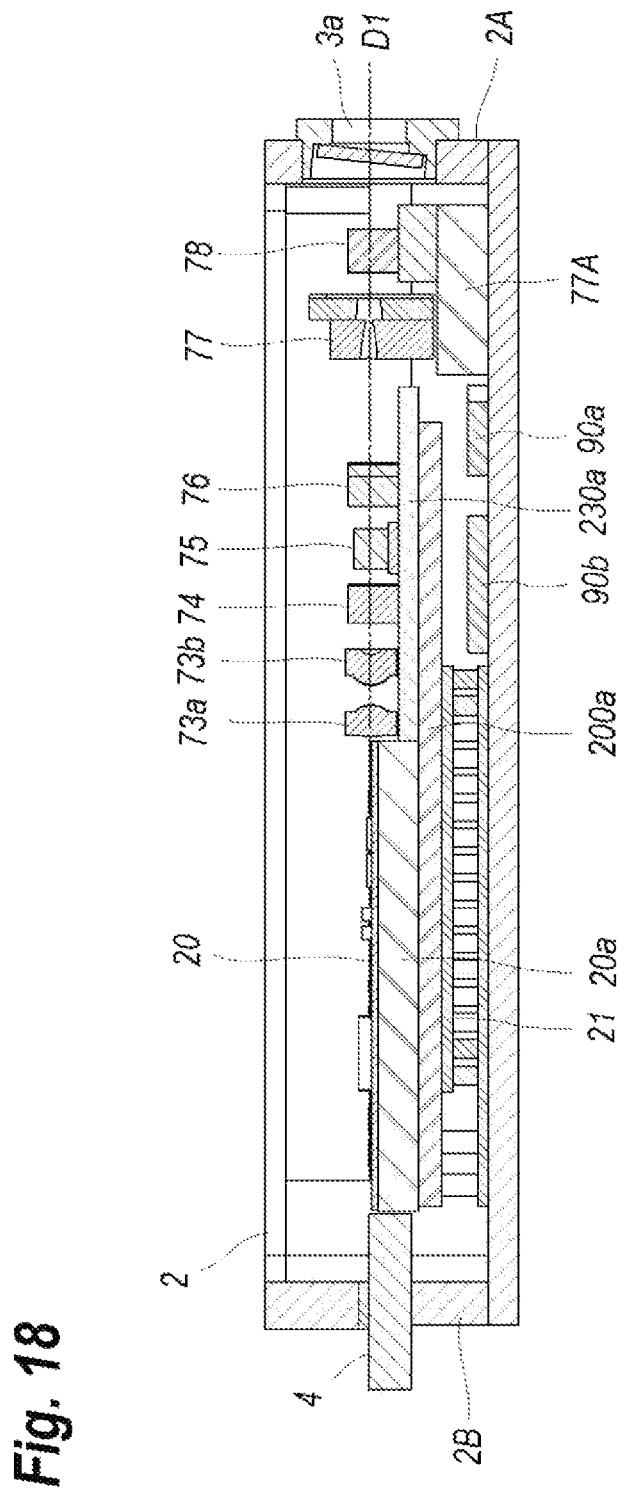
FIG. 18 shows a cross section of the optical module taken along the optical axis extended from the first output port.

FIG. 18 schematically shows a cross section of the optical module 1 taken along the optical axis of the first output port 3*a*. The output unit 230 is mounted on the area A3 of the base 200*a* projecting from the second TEC 21 via the carrier 230*a*, which forms a space under the output unit 230. The optical module 1 installs two wiring substrates, 90*a* and 90*b*, in this space to supply the biases from the DC terminals 5B in the side wall 2D to the t-LD 10.

Figure 19:
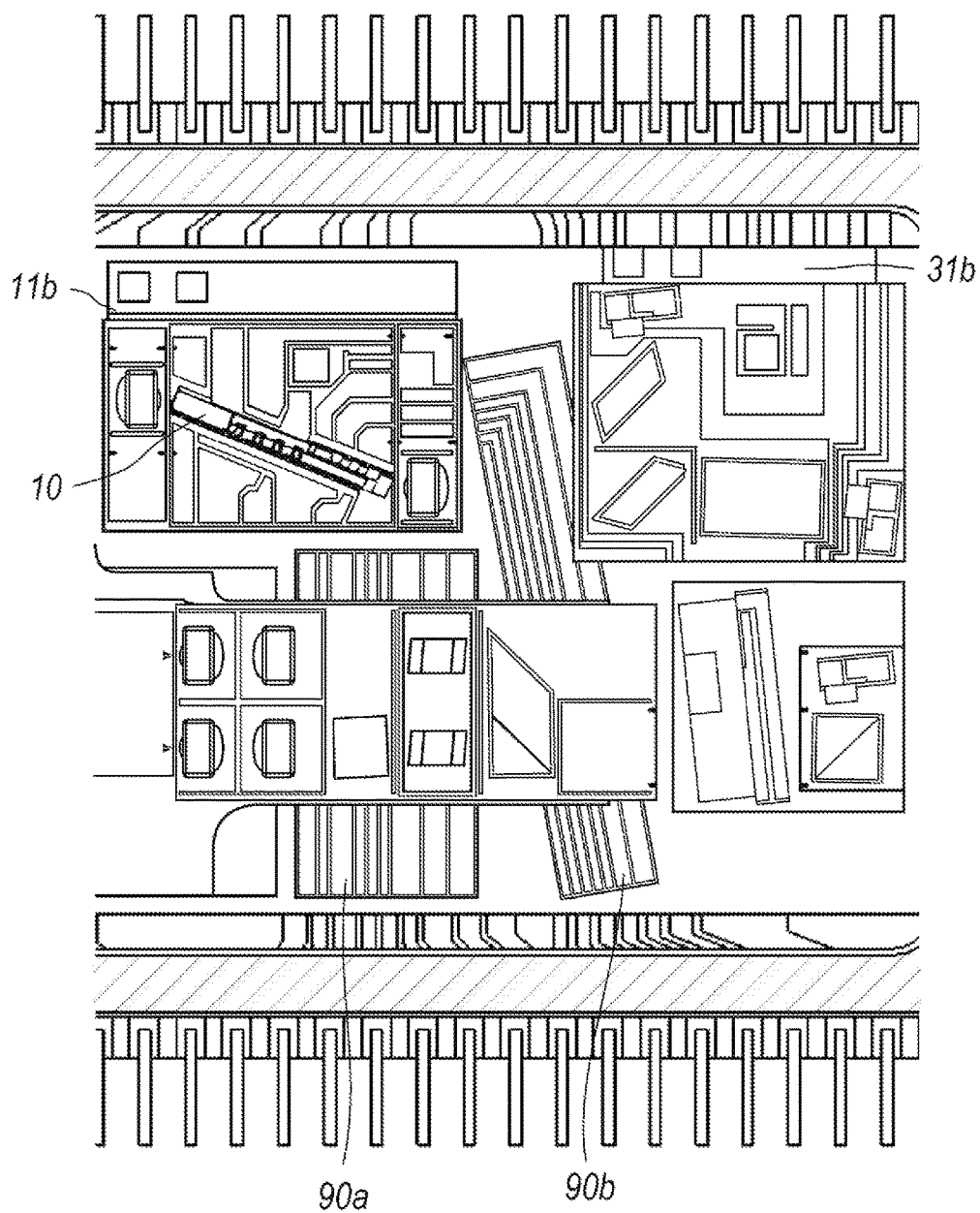
FIG. 19 is a plan view of the arrangement along the wiring substrates, the laser unit, and the detector unit.
Figure 20:
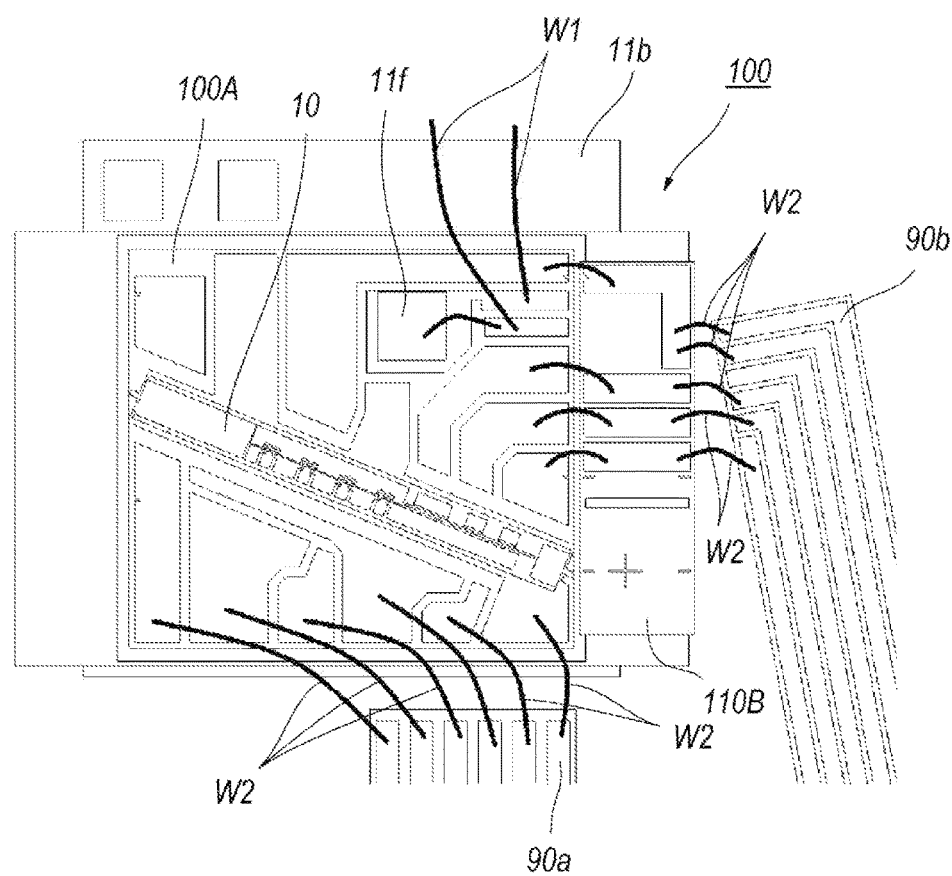
FIG. 20 is a plan view of the arrangement around the laser unit including two wiring substrates.
Figure 21:
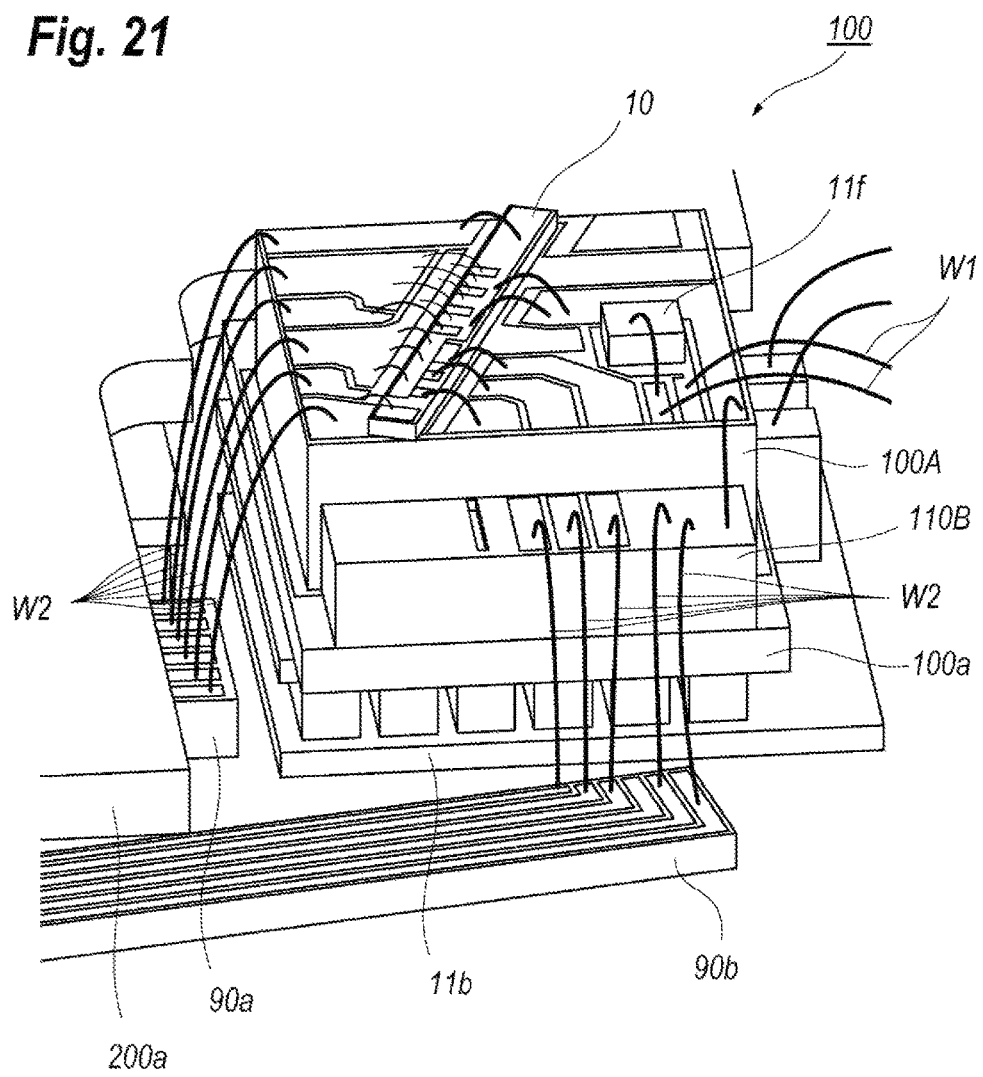
FIG. 21 is a perspective view of the laser unit and two wiring substrates.

FIGS. 19 and 20 are plan views of the arrangement around the wiring substrates, 90*a* and 90*b*, and FIG. 21 is a perspective view of the wiring between the wiring substrates, 90*a* and 90*b*, and the laser unit 100. As already described, the t-LD 10 of the present embodiment is necessary to be biased in the electrodes, 14*a* to 14*e*, to inject carriers into two SOAs, 10*a* and 10*d*; in the heaters, 15*a* and 15*b*, in the SG-DFB 10*b*, and the heaters, 17*a* to 17*c*, in the CSG-DBR 10*c*; in two heater grounds; and in the signal ground, where total of ten (10) electrodes are necessary to be supplied with respective biases. In a case where these electrodes are biased from the DC terminals 5*a* arranged in the side wall 2C closer to the laser unit 100 compared with the other side wall 2D, the DC terminals 5*a* in the number thereof occasionally becomes insufficient when the detector unit 300 and the modulator unit 200 are also biased from the DC terminals 5*a*. On the other hand, the other side wall 2D along the modulator unit 200 leaves spares of the DC terminals 5*b* not connected to anywhere. Accordingly, the optical module 1 supplies the biases to the t-LD 10 from the DC terminals 5*b* in the side wall 2D via the wiring substrates, 90*a* and 90*b*.

As shown in FIGS. 20 and 21, the LD carrier 100A mounts the t-LD 10 and the thermistor 11*f* thereon. Two wires W1 extracted from the thermistor 11*f* are connected to the DC terminals 5*a* in the closer side wall 2C. The other wires W2 are extracted to the DC terminals 5*b* in the other side wall 2D through the wiring substrates, 90*a* and 90*b*. The wiring substrate 90*a* closer to the second TEC 21 has a thickness greater than that of the other wiring substrate 90*b* because of a room to wire the respective substrates, 90*a* and 90*b*. That is, the wiring for the wiring substrate 90*a* is necessary to be done in a space between the base 200*a* and the first TEC 11. On the other hand, the wiring to the other substrate 90*b* may be done in a space between the carrier 300*a* of the detector unit 300 and the lens carrier 100B, which is relatively wider than the former space. Thus, a space relatively wider is left for the wiring to the wiring substrate 90*b*.

The carrier 300*a* of the detector unit 300 and the lens carrier 110B on the base 100*a* of the laser unit 100, where they sandwich the wiring substrate 90*b* therebetween, have relatively thinner thicknesses to mount the BSs, 32*a* and 32*b*, and the collimating lens 110*b* thereon. On the other hand, the other wiring substrate 90*a* which locates next to the LD carrier 100A with a thickens thereof greater than a thickness of the lens carrier 110B to align the level of the optical axis of the t-LD 10 and that of the collimating lens 110*b* with each other, which means that the top of the t-LD 10 is higher than the top of the lens carrier 110B and that the wiring substrate 90*a* is necessary to have a thickness thereof to reduce the difference in the top level between the t-LD 10 and that of the wiring substrate 90*a*.

Second Embodiment

Figure 22:
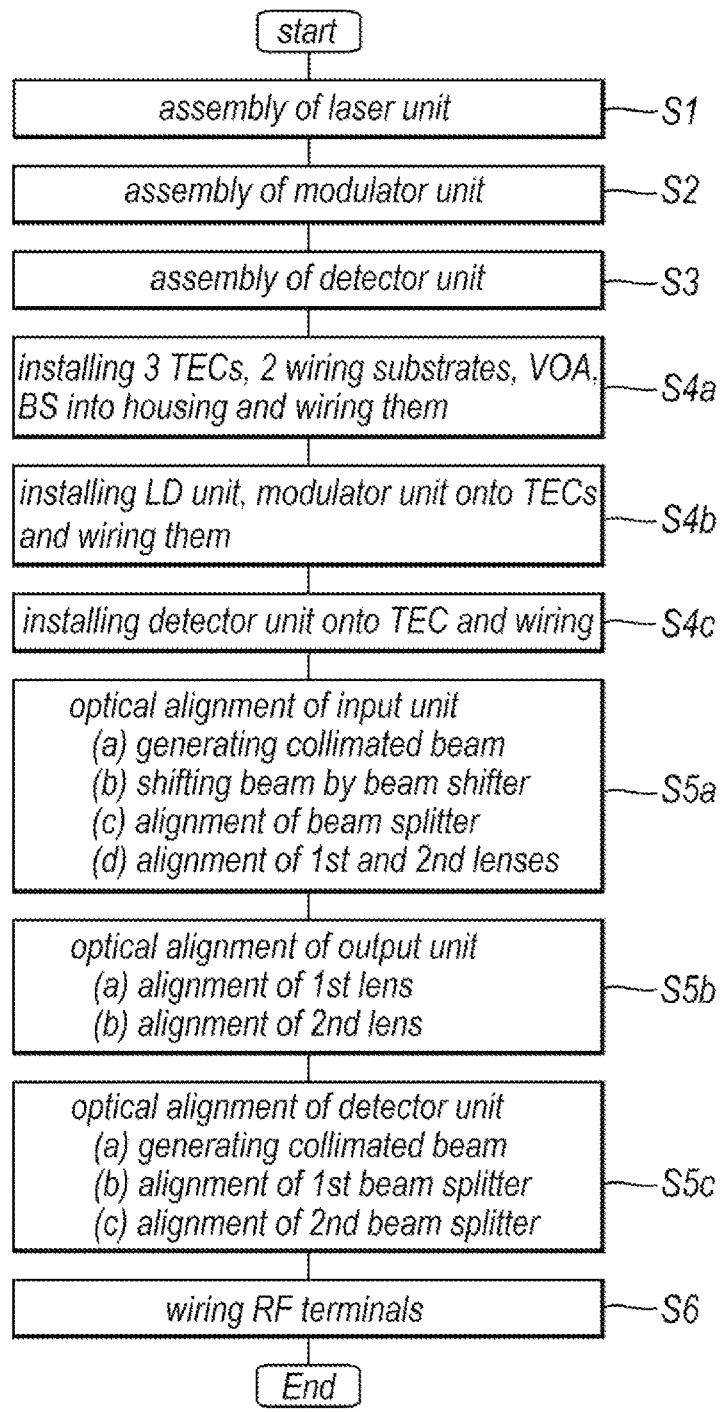
FIG. 22 shows a flow chart of a process to assembly the optical module shown in FIG. 1.

FIG. 22 shows a flow chart of a process of assembling the optical module of the first embodiment. Next, the process of assembling the optical module 1 will be described.

S1: Assembling of Laser Unit

Figure 23:
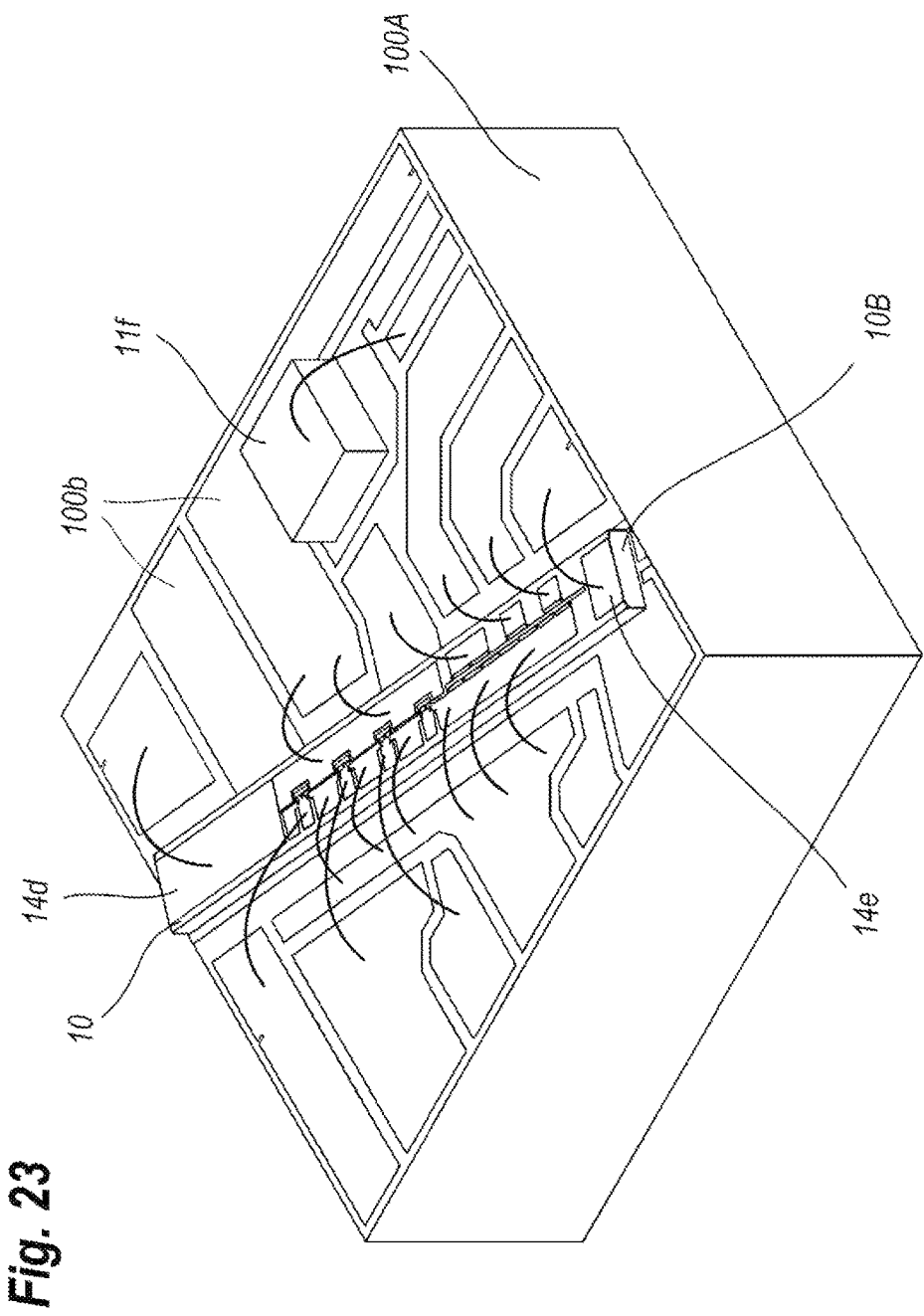
FIG. 23 shows a process to assemble the t-LD on the LD carrier.

The process first assembles the laser unit 100 independent of the optical module 1. The t-LD 10 and the thermistor 11*f* are mounted on metal patterns on the LD carrier 100A by a conventional die-mount process using eutectic solder of gold tin (AuSn). FIG. 23 is a perspective view of the t-LD 10 mounted on the LD carrier 100A. The t-LD 10 is mounted on a metal pattern provided on the top of the LD carrier 100A and wire-bonded from electrodes corresponding to the metal patterns 100*b*. After the wire-boding, the t-LD 10 may be tested in the DC mode, such as the I-L characteristic of the t-LD 10, and so on, by probing the metal patterns 100*b*. When the DC test finds any failures in a t-LD 10; such t-LD 10 is extracted from the subsequent production.

S2: Assembling Modulator Unit

Figure 24:
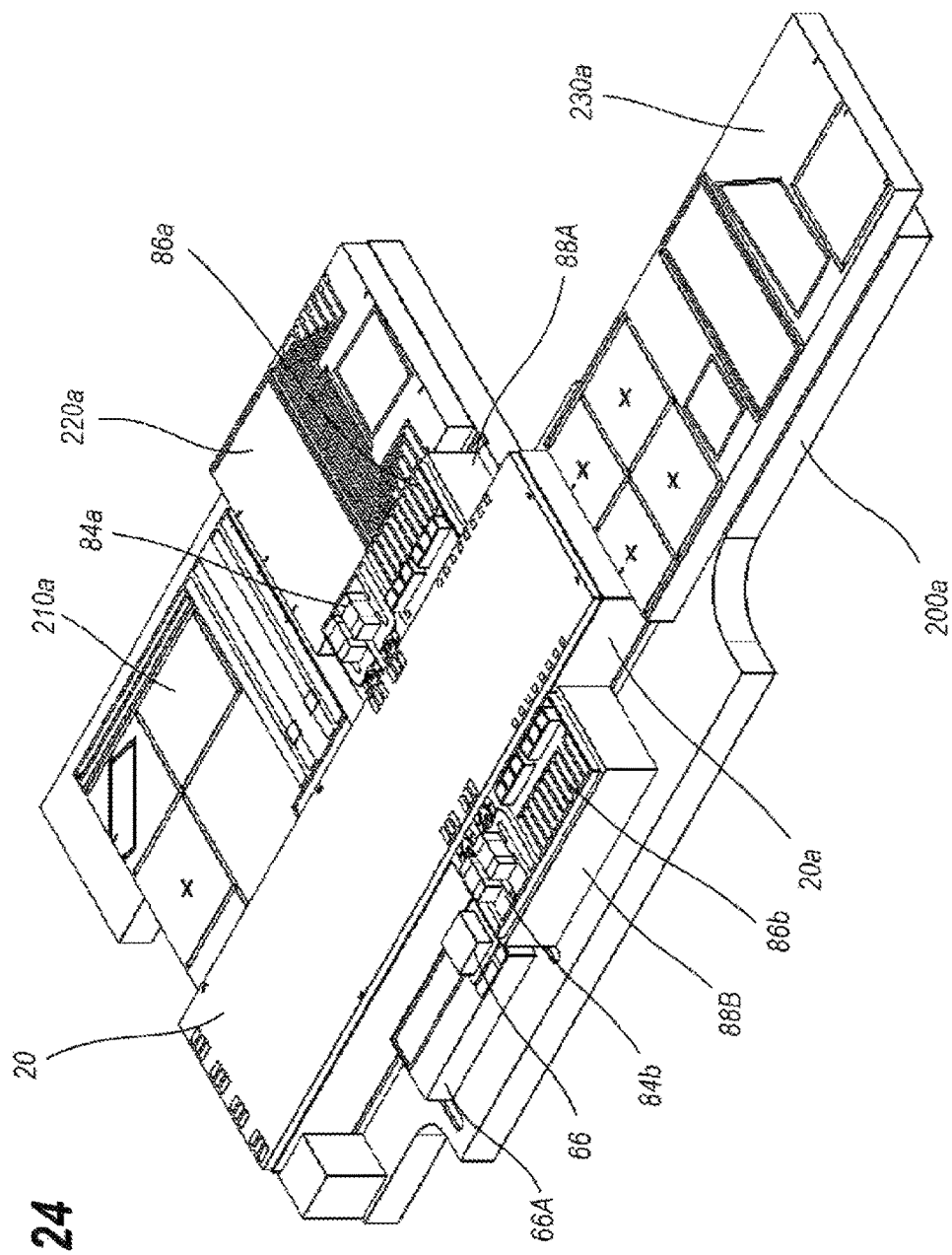
FIG. 24 shows a process to assemble the optical modulator, the input unit, the joint unit, two bias units, two terminator units, and two PD sub-mount on the base of the modulator unit.

FIG. 24 is a perspective view of the modulator unit 200. The process of assembling the modulator unit 200 is also carried out independent of the assembly of the optical module 1. Specifically, the optical modulator 20 is mounted in a center area 200A of the base 200*a* as shown in FIG. 9 via the modulator carrier 20*a*; then, the terminator unit 84*a* and the bias unit 86*a*, and the terminator unit 84*b* and the bias unit 86*b* are mounted in the areas, A3 and B2, of the sides of the optical modulator 20 on the base 200*a*, respectively. These areas, A3 and B2 put the optical modulator 20 therebetween. The terminator units, 84*a* and 84*b*, solder two chip capacitors 85*d* in advance to be mounted on the base 200*a*. The terminators 85*b*, which are the type of thin film resistor, are formed concurrently with the formation of the interconnections 85*h* on the terminator units, 84*a* and 84*b*. Although the optical module 1 of the embodiment uses the chip capacitors 85*d*, the optical module 1 may mount the die-capacitors on the terminator units, 84*a* and 84*b*. For the bias units, 86*a* and 86*b*, the die-capacitors 87*a* are soldered on the bias units, 86*a* and 86*b*, in advance to be mounted on the base 200*a*. The terminator unit 84*a* and the bias unit 86*a*, and the terminator unit 84*b* and the bias unit 86*b* are mounted on the base 200*a* via the carriers, 88A and 88B, respectively, where these carriers, 88A and 88B have thicknesses such that the terminator units, 84*a* and 84*b*, and the bias unit, 86*a* and 86*b*, in respective top levels become substantially comparable with the top level of the optical modulator 20.

In the process S2 above, the carrier 20*a* is first soldered with the base 200*a* by a eutectic solder, and the optical modulator 20 is next soldered on the carrier 20*a* also by a eutectic solder. Subsequently, the carrier 210*a* for the input unit 210, which may be referred as the second carrier, the carrier 220*a* for the joint unit 220, which may be referred as the third carrier, the carries, 88A and 88B, commonly for the terminator units, 84*a* and 84*b*, and the bias units, 86*a* and 86*b*, the carrier 66A for mounting the m-PD 64*b* via the PD sub-mount 64B are also soldered in respective areas on the base 200a. The carrier 66A mounts a thermistor 66 thereon. Accordingly, the carrier 66A may be called as the thermistor carrier. At the process for soldering the input carrier 210a on the base 200a, a rough alignment of the carrier 210a is carried out.

Figure 25:
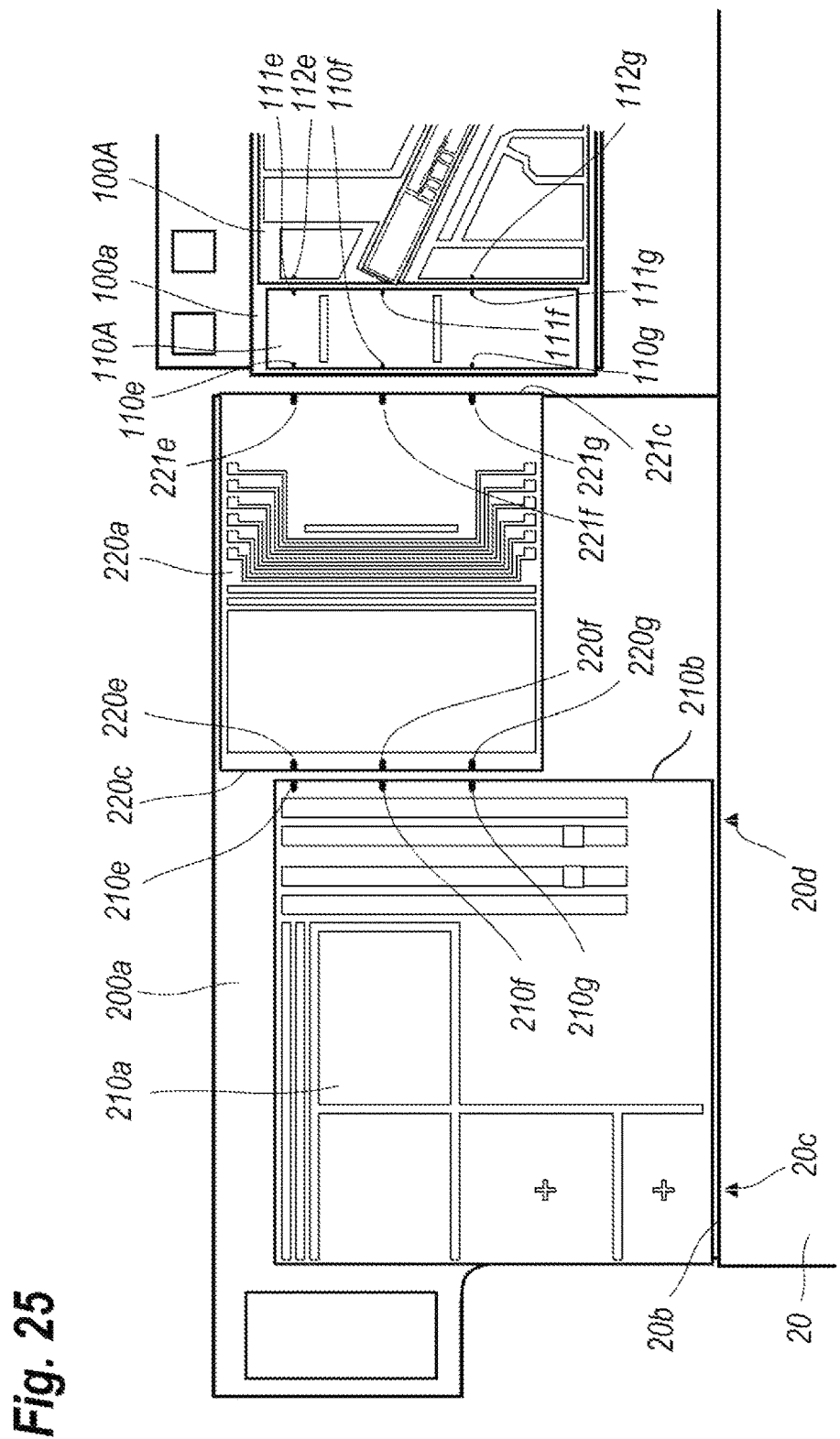
FIG. 25 shows a process to align the joint unit and the input unit on the base of the modulator unit with the laser unit.

Specifically, referring to FIG. 25, the carrier 210a includes a side 210b, which faces the side 220c of the joint unit 220, with marks, 210e to 210g, linearly extending inward from the edge of the carrier 210a. The center mark 210f substantially aligns with the optical axis of the first CW light L1 coming from the laser unit 100 to the BS 61. The side marks, 210e and 210g, have distances equal to each other. Aligning the marks, 210e to 210g, with the marks, 220e to 220g, on the carrier 220a of the joint unit 220, the input unit 210 may be roughly aligned with the joint unit 220 only by the visual inspection.

The optical modulator 20 also provides marks, 20c and 20d, along the edge 20b facing the input unit 210. The former mark 20c corresponds to the input port 24, while, the latter mark 20d indicates the monitor port 25a. These marks, 20c and 20d, have a shape of an isosceles divided into two part by a line evenly dividing a corner constituting the isosceles sides. However, the shapes of those marks, 210e to 210g, 220e to 220g, and 20c to 20d, are optional.

Using those alignment marks, the rough alignment of the input port 24 of the optical modulator 20 with the carrier 210a, and that between the carrier 210a of the input unit 210 and the carrier 220a of the joint unit 220 may be carried out only by the visual inspection. For the alignment of the m-PD 64a with the monitor port 25a, because of a large sensitive surface of the m-PD 64a, only the rough alignment by the visual inspection may achieve an optical coupling efficiency between the m-PD 64a and the monitor port 25a with practically acceptable level.

Figure 26:
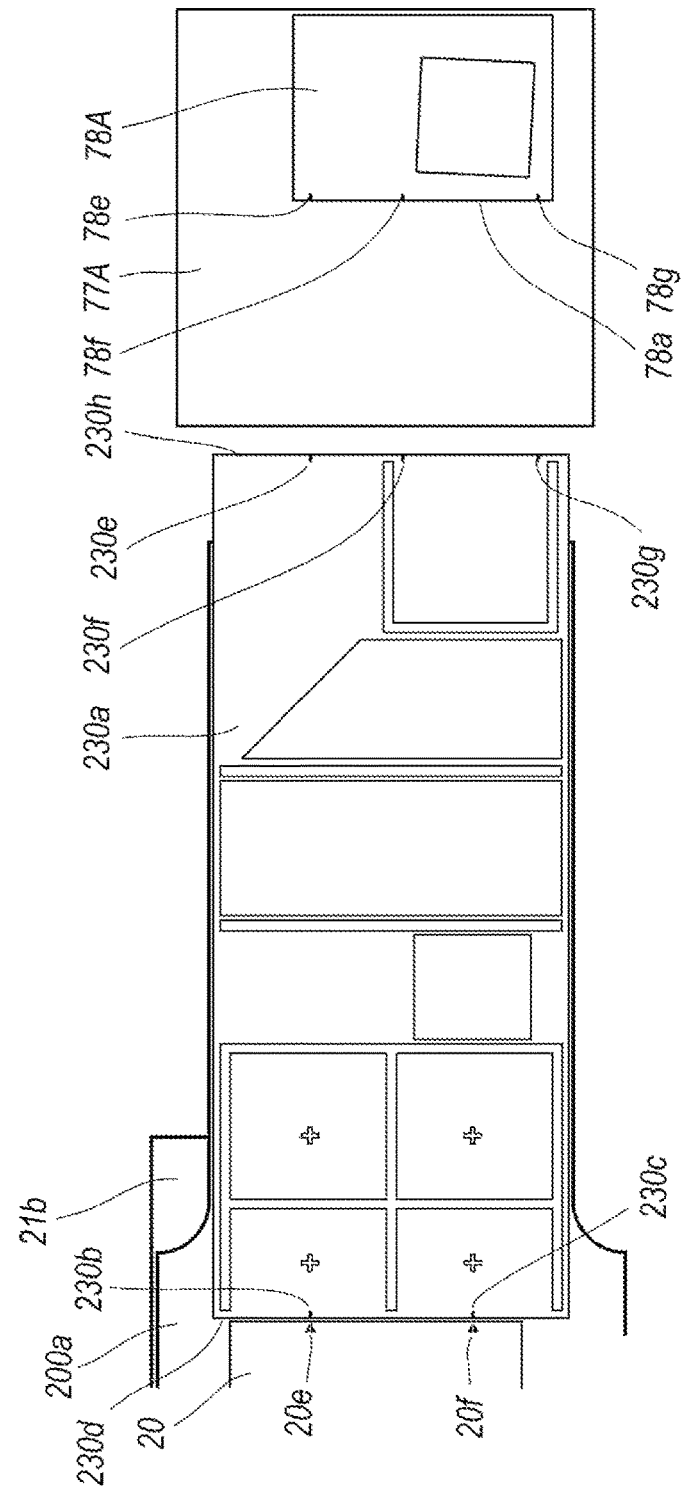
FIG. 26 shows a process to assemble the output unit with the optical modulator.

Referring to FIG. 26, the carrier 230a of the output unit 230, which may be referred as the fourth carrier, provides in a side 230d facing the optical modulator 20 two marks, 230b and 230c. Similarly, the optical modulator 20 provides two marks, 20e and 20f, in a side facing the output unit 230. The mark 230b in the carrier 230a aligns with the mark 20b of the optical modulator 20 and also with the optical axis of the modulated beam M2b. The mark 230c aligns with the mark 20e and corresponds to the optical axis of the modulated light M2c.

The carrier 230a also provides three marks, 230e to 230g, in a side 230h facing the VOA carrier 77A. The BS carrier 78A also provides three marks, 78e to 78g, in a side 78a facing the carrier 230a. These marks, 78e to 78g, in the BS carrier 78A align with the marks, 230e to 230g, in the carrier 230a of the output unit 230. The two modulated beams, M2b and M2c, output from the optical modulator 20 are multiplexed as passing through the BS 78. Thus, the rough alignment of the carrier 230a with the optical modulator 20 and the BS carrier 78a with the carrier 230a of the output unit 230 may be easily performed only by the visual inspection of those marks.

The process of assembling the optical module 1 of the present embodiment omits fine alignments for the BS 78 and the m-PD 79a to be mounted on the BS carrier 78A. Only the visual inspection of those marks, 78e to 78g, and 230e to 230g, for the BS 78 and the m-PD 29a may align the output unit 230 with the optical modulator 20 and the BS.

After mounting those carriers, 210a, 220a, and 230a on the base 200a, the pads on the optical modulator 20 are wire-bonded to the interconnections on respective carriers. Specifically, the pads, 45a and 45b, on the optical modulator 20 are wire-bonded to the terminators 85b on the terminator units, 84a and 84b; the interconnections 85h on the terminator units, 84a and 84b, are wire-bonded to the interconnections on the carrier 220a of the joint unit 220; the pads, 46a and 46b, on the optical modulator 20 are also wire-bonded to the die capacitors 87a on the bias units, 86a and 86b; the die capacitors 87a are wire-bonded to the interconnections 87b on the bias units, 86a and 86b; and the interconnections 87b on the bias units are wire-bonded to the interconnections 220d on the carrier 220a of the joint unit 220.

The embodiment thus described, the terminator unit 84 and the bias unit 86a are commonly mounted on the carrier 88A, and the terminator unit 84b and the bias unit 86b are also commonly mounted on the carrier 88B. However, the carriers, 88A and 88B, may be divided into two parts, one of which mounts the terminator units, 84a and 84b, and the other mount the bias units, 86a and 86b. Further, the terminator unit 84a and the bias unit 86a disposed in the side of the side wall 2C of the housing may have a substrate common to those units, 84a and 86a. Similarly, the terminator unit 84b and the bias unit 86b arranged along the side wall 2D may have a substrate common to each units, 84b and 86b. Because the bias units, 86a and 86b, and the terminator units, 84a and 84b, in portions outside of the terminators 85b process DC signals; respective common substrates do not degrade or affect the operation of the optical modulator 20, rather, the assembly of the bias units and the terminator units may be simplified.

Assembling Detector Unit

The process mounts the thermistor 31f, two m-PDs, 34a and 34b, as interposing respective PD sub-mounts, 34A and 34B, on the carrier 300a, in the outside of the housing 2. Those components are fixed on respective metal patterns by eutectic solder. As already described, the m-PDs, 34a and 34b, have wide optical sensitive areas with diameters thereof greater than several scores of micron-meters; accordingly, the m-PDs, 34a and 34b, are unnecessary to be actively aligned with the t-LD 10. The etalon filter 33 is also mounted on the carrier 300a in this process.

S4: Assembling Optical Module

S4a: Installing Three TECs

Figure 27:
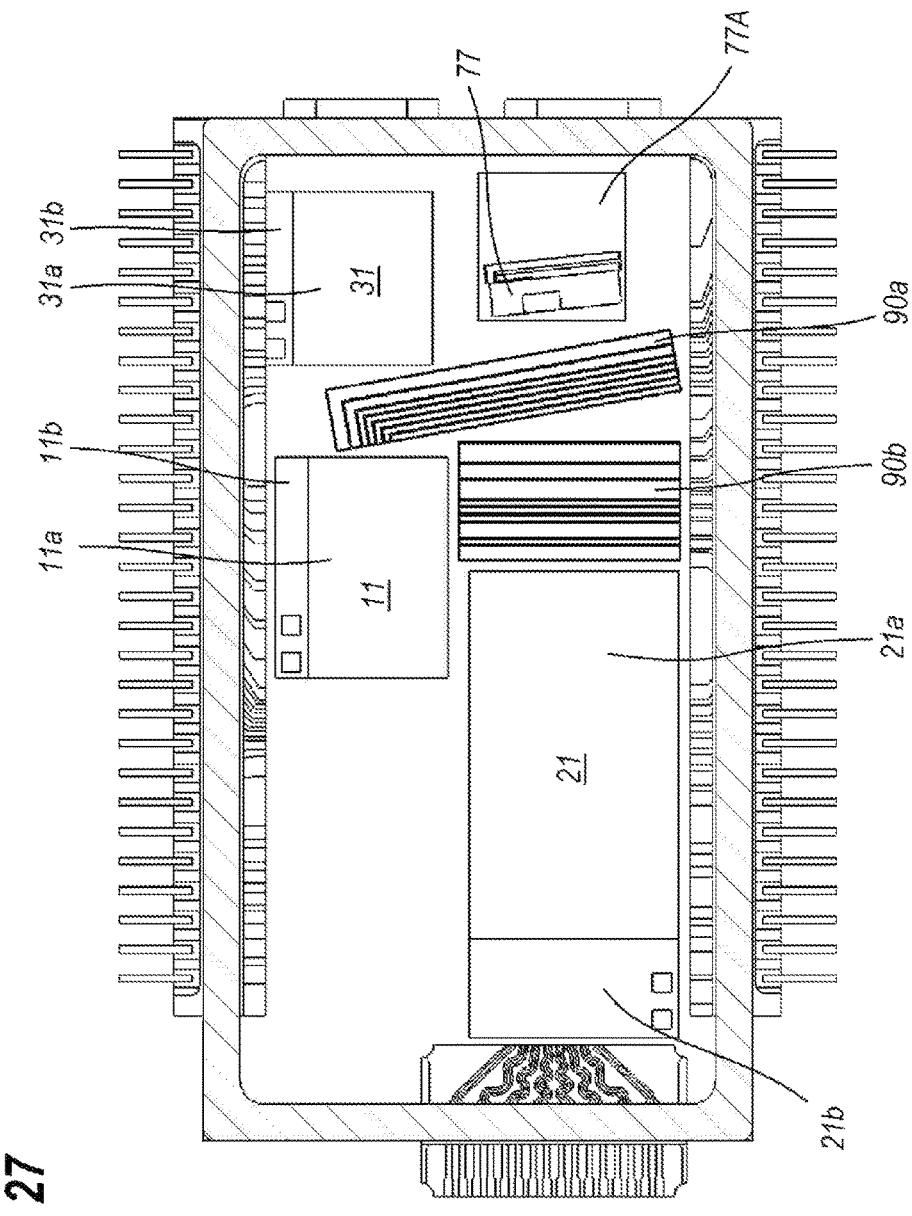
FIG. 27 is a plan view showing a process to install the TECs, the wiring substrates, and the VOA substrate into the housing of the optical modulator.

FIG. 27 is a plan view showing a process of installing three TECs, 11 to 31, within the housing 2. The VOA carrier 77A, that mounts the VOA 77 in advance to the installation thereof, and two wiring boards, 90a and 90b, are concurrently installed within the housing 2. A conventional technique of the die-bonding is applied to the installation of those devices. As shown in FIG. 27, the bottom plates, 11b to 21b, of the respective TECs, 11 to 31, prepare posts in areas exposed from the respective top plates, 11a to 31a, to supply the driving currents to the Peltier elements. Those posts are wire-bonded to the DC terminals, 5a and 5b, in the respective side walls, 2C and 2D, after the installation of the TECs, 11 to 31.

S4b: Mounting Laser Unit and Modulator Unit on Respective TECs

The step S4b mounts the base 100a of the laser unit 100, which is assembled in the step S1, and the base 200a of the modulator unit 200, which mounts various units thereon in the step S2, on the respective TECs, 11 and 21.

Figure 28:
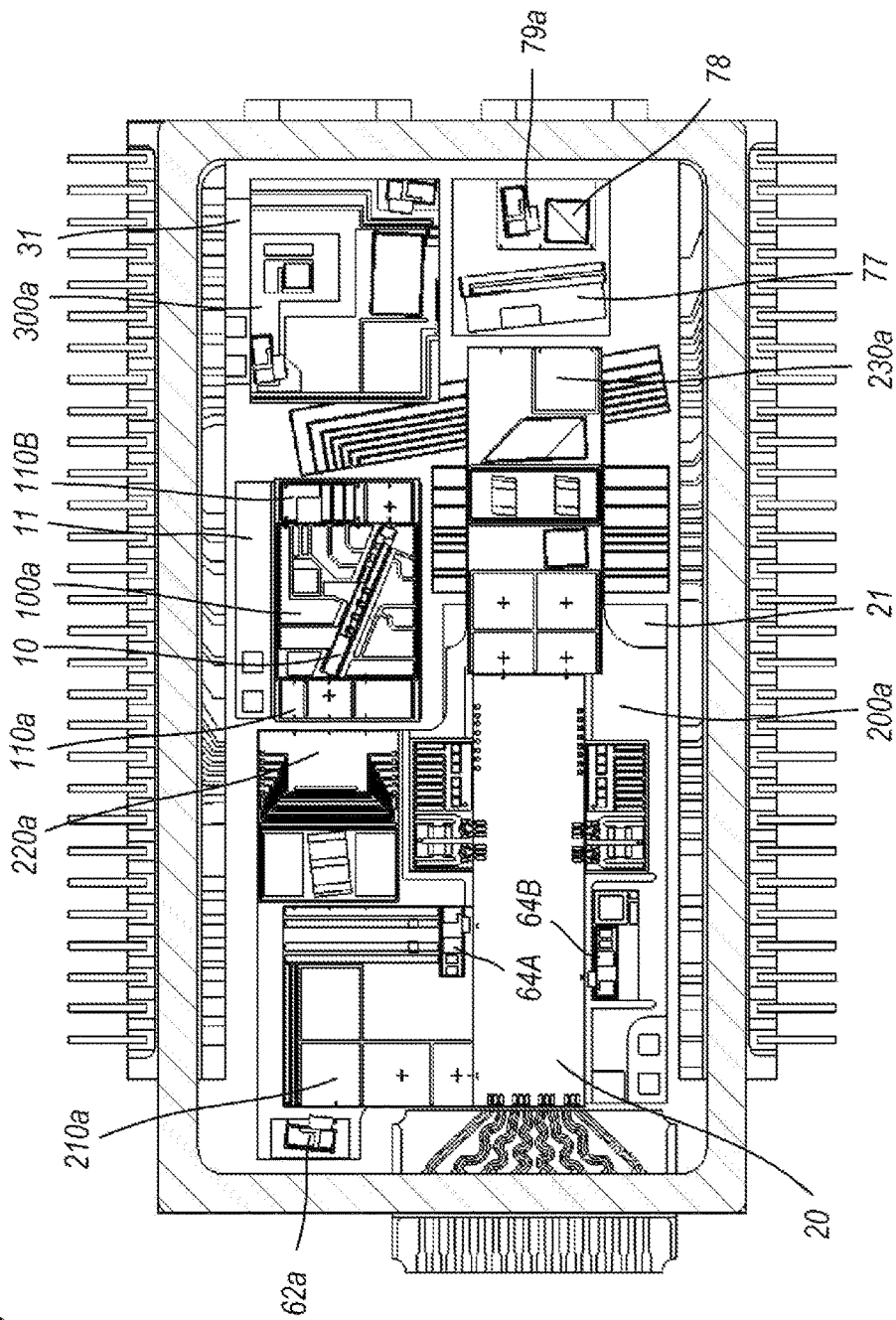
FIG. 28 is a plan view showing a process to mount the LD carrier and the lens carriers on the first TEC, the base of the modulator unit, which mounts the input unit, the joint unit, the output unit, the bias units, the terminator units, and the PD sub-mounts thereon.
Figure 29:
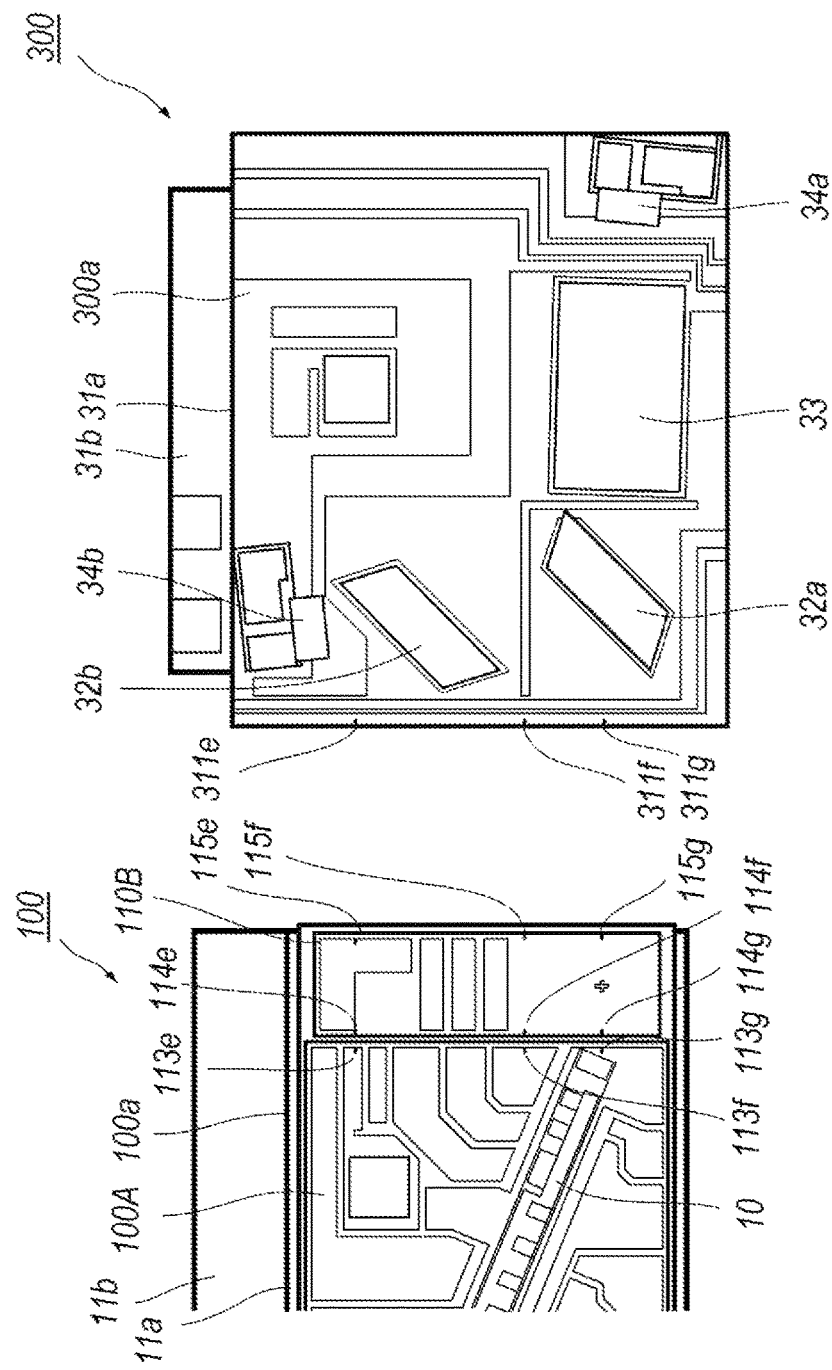
FIG. 29 shows a process to align the detector unit with the laser unit.

FIG. 28 is a plan view showing the process which the laser unit 100, the modulator unit 200, and the detector unit 300 are mounted on the respective TECs, 11 to 31, in the housing 2. Optical components required for the active alignment are not implemented therewith. Specifically, the LD carrier 100A that mounts the t-LD 10 by the first eutectic solder in advance to the present step is mounted on the base 100a of the laser unit 100 by the second eutectic solder whose melting point is lower than that of the first eutectic solder. In the present embodiment, the first eutectic solder is made of SnAgCuBi with a melting point of about 240 C.°. Concurrently with the installation of the LD carrier 100A on the base 100a, two lens carriers, 110A and HOB, are set on the base 100a. Referring to FIG. 25 again, the LD carrier 100A provides two marks, 112e and 112g, and the lens carrier 110A provides marks, 111e to 111g. Aligning the marks, 111e to 111g, on the lens carrier 110A with the marks, 112e and 112g, on the LD carrier 100A only by visual inspection, the lens carrier 110A may be roughly aligned with the LD carrier 100A. Referring to FIG. 29, the other lens carrier 110B may be also mounted on the base 100a by aligning marks, 114e to 114g, on the lens carrier 110B with marks, 113e to 113g, on the LD carrier 100A in the side opposite to that appearing in FIG. 25. The two lens carriers, 110A and 110B, are mounted on the base 100a but the collimating lenses, 110a and 110b, are not placed on respective positions on the lens carriers, 110A and 110B. The base 100a thus mounting the LD carrier 100A and the two lens carriers, 110A and 110B, is to be set on the TEC 11.

The base 200a of the modulator unit 200, which mounts the various units including the input unit 210 and the joint unit 220, is also fixed on the second TEC 21 by an eutectic solder. Referring to FIG. 25 again, the carrier 220a of the joint unit 220 provides the marks, 221e to 221g, in a side 221c facing the laser unit 100. On the other hand, the lens carrier 110A of the laser unit 100 also provides marks, 110e to 110g, in a side facing the joint unit 220. Aligning these marks, 221e to 221g, with the marks, 110e to 110g; the modulator unit 200 may be roughly aligned with the laser unit 100. The rough alignment using these marks described above may simplify the fine alignment subsequently carried out for lenses and so on. Positions, where the lenses are to be mounted, provide indices on the respective carriers. However, when the respective carriers are largely misaligned, the fine alignment sometimes becomes unable, because even the components to be finely aligned is set on the indices, substantial optical coupling efficiency could not be obtained. The alignment process inevitably begins a step to find a position at which substantial coupling efficiency is realized.

S4c: Mounting Detector Unit on TEC

The process next installs the carrier 300a of the detector unit 300 onto the third TEC 31, where the carrier 300a assembles the thermistor 31f, two m-PDs, 34a and 34b, and the etalon filter 33 thereon. Referring to FIG. 29, the lens carrier 110B which is assembled on the LD carrier 100A in the aforementioned process provides marks, 115e to 115f, in a side opposite to that facing the LD carrier 100A. The carrier 300a of the detector unit 300 is mounted on the third TEC 31 such that marks, 311e to 311f, on the carrier 300a are visually aligned with the marks, 115e to 115g, on the lens carrier 110B. Thus, the detector unit 300 is roughly aligned with the laser unit 100.

S5: Optical Alignment

S5a: Alignment of Input Unit

Figure 30:
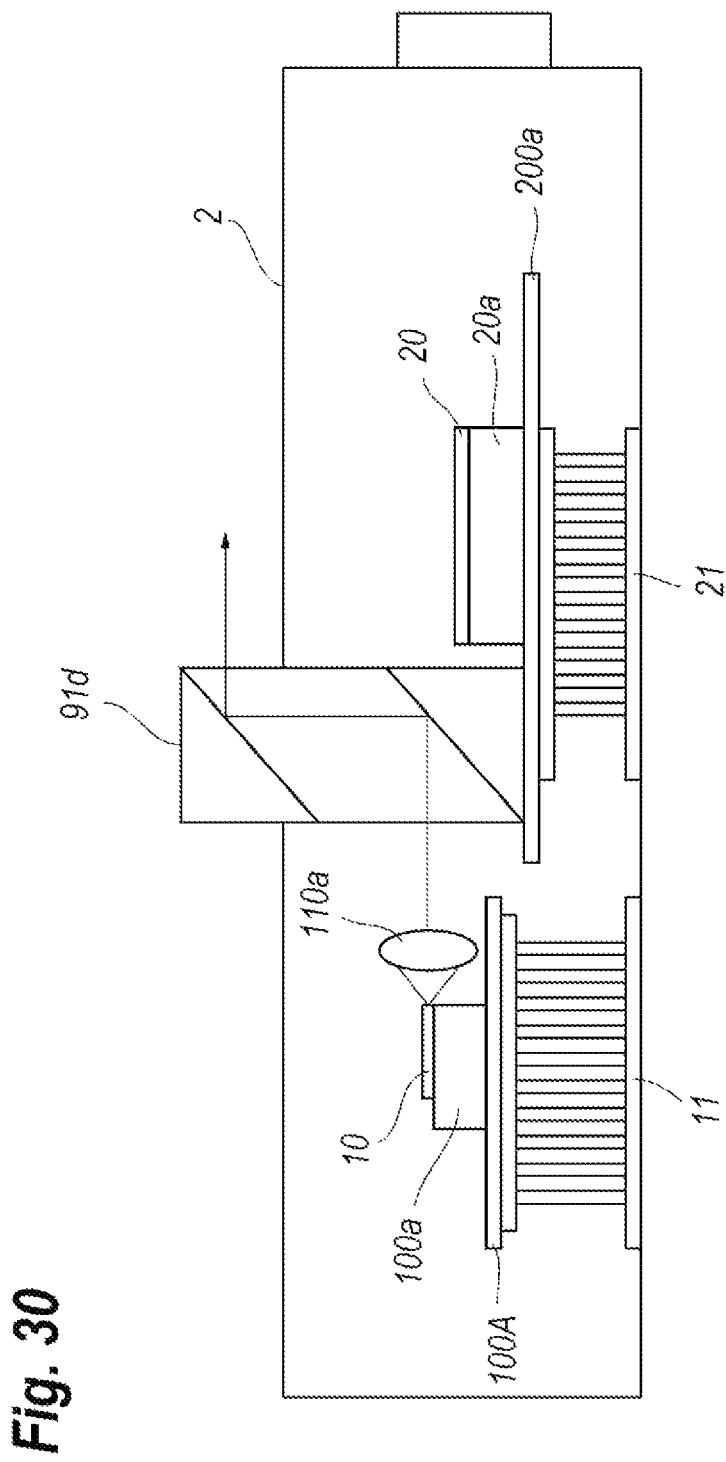
FIG. 30 shows a process to align the first collimating lens in a position at which the output beam of the collimating lens becomes a collimated beam.

The process finally assembles optical components that are required for active alignment. The step S5a first aligns the input unit 210 of the modulator unit 200 with the laser unit 100 in step S5a(a). Specifically, the first collimating lens 110a in the laser unit 100 is necessary to be set in a position where an optical beam output from the first collimating lens 110a becomes a collimated beam. Referring to FIG. 30, the process first sets a special tool 91d on a position to which the beam shifter 81 is placed as practically activating the t-LD 10 to emit the dispersive light therefrom. The special tool 91d, which provides two mirrors fixed in parallel to each other and making an angle of 45° with respect to the optical axis, guides the first CW light L1 output from the t-LD 10 outside of the housing 2 by the parallel translation. Checking the collimation of the first CW light L1 by an optical detector set apart from the housing 2, where the optical detector is set apart about one (1) meter from the optical module in the present embodiment, as sliding the first collimating lens 110a along the optical axis thereof, the first collimating lens 110a is fixed in a position where the output beam becomes a collimated beam.

Figure 31:
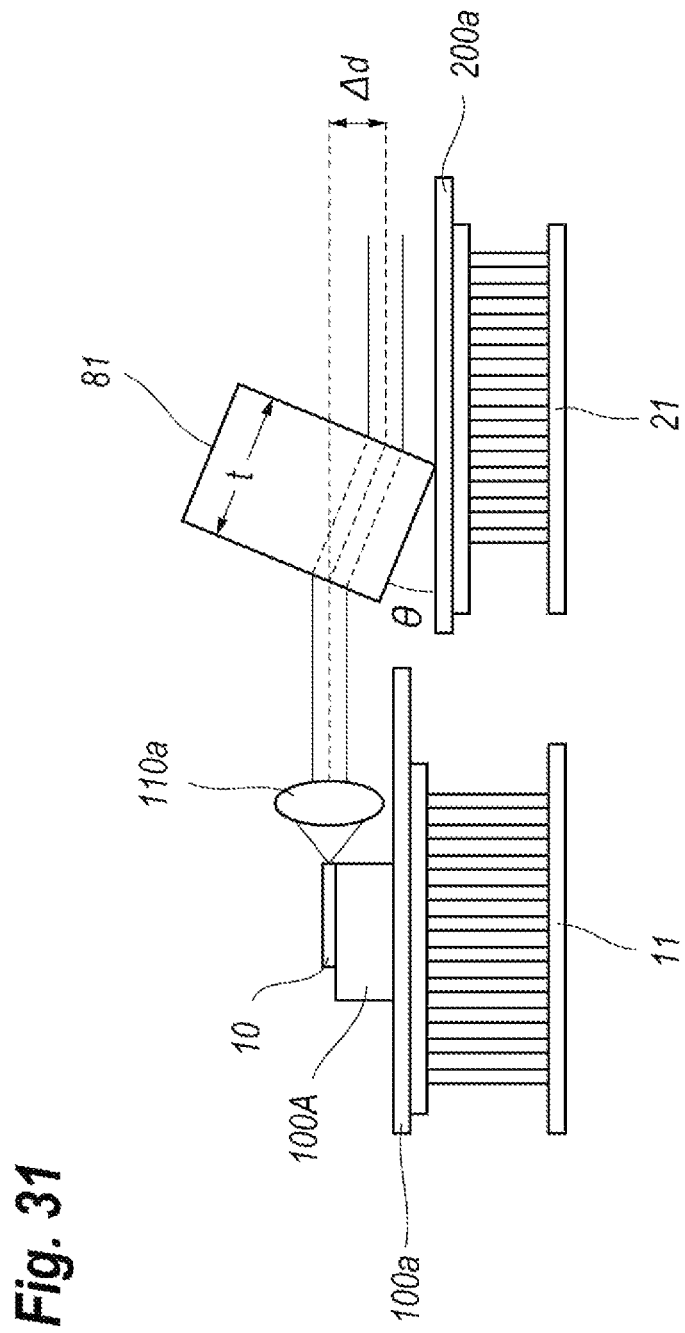
FIG. 31 shows a process to shift the optical axis of the laser unit so as to be aligned with the optical axis of the optical modulator.

Then, removing the special tool 91d and setting the beam shifter 81 on the carrier 220a of the joint unit 220, the process may compensate the offset between the optical axis of the CW light L1 of the laser unit 100 and that of the modulator unit 200. Referring to FIG. 31, the first TEC 11 mounts the t-LD 10 and the collimating lens 110a thereon, while, the modulator unit 200 mounts the optical modulator 20 on the second TEC 21 through the base 200a independent of the first TEC 11. Accordingly, the optical axis of the t-LD 10 and that of the optical modulator 20 are usually not aligned in the levels thereof, namely, offset each other. The optical coupling system mounted on the input unit 210, that is, the BS 61 and the two-lens system 63, may compensate this discrepancy of the optical axes. However, it would be hard enough to compensate the discrepancy solely by the BS 61. A rotation angle, an elevation angle, and/or a depression angle are required to align the BS 61. Moreover, it would be physically impossible for the two-lens system to lower them beyond the top of the carrier 210a. Also, when the lenses, 63a and 63b, are set apart from the carrier 210a beyond a designed distance, the resin that fixes the lenses, 63a and 63b, degrades the reliability thereof. Accordingly, the beam shifter 81 of the embodiment compensates the offset in the optical axes between the laser unit 100 and the modulator unit 200. The beam shifter 81 of the present embodiment may be a parallel-piped block made of material transparent to the CW beam L1 and may offset the optical axis of the incident beam by setting the incident surface thereof inclined to the optical axis of the incident beam.

FIG. 31 schematically shows a process of aligning the beam shifter 81 at step S5a(b). The process measures the level of the first CW light L1 output from the collimating lens 110a and that of the input port 24 of the optical modulator 20 in advance to a process of assembling the beam shifter 81. The former level may be measured concurrently with the process of forming the collimated beam in the output of the first collimating lens 110a. From two evaluated values above described, the inclined angle of the beam shifter 81 may be estimated from the following equation:

$$\Delta d = t \times \sin\theta \times (1 - \cos\theta) / \sqrt{(n^2 - \sin^2\theta)},$$

where $\Delta d$, $t$, $n$, and $\theta$ are the offset between two optical axes, a thickness of the beam shifter 81, refractive index of the material constituting the beam shifter 81 and an angle to be inclined for the beam shifter 81, respectively. Evaluating the angle $\theta$ from the equation above, the beam shifter 81 is passively set so as to make the angle $\theta$ with respect to the carrier 210a without any active alignment.

Figure 32:
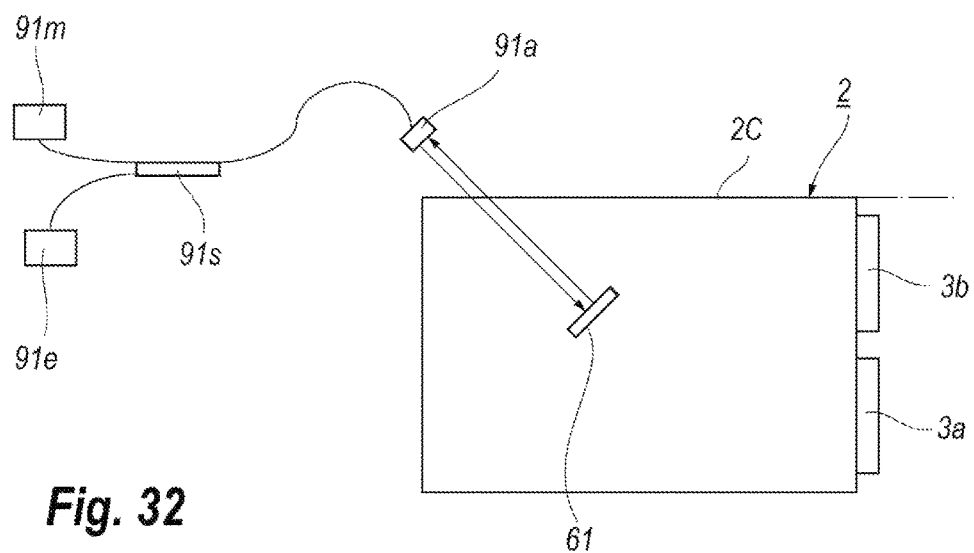
FIG. 32 shows a process to align the beam splitter in the input unit.
Figure 33:
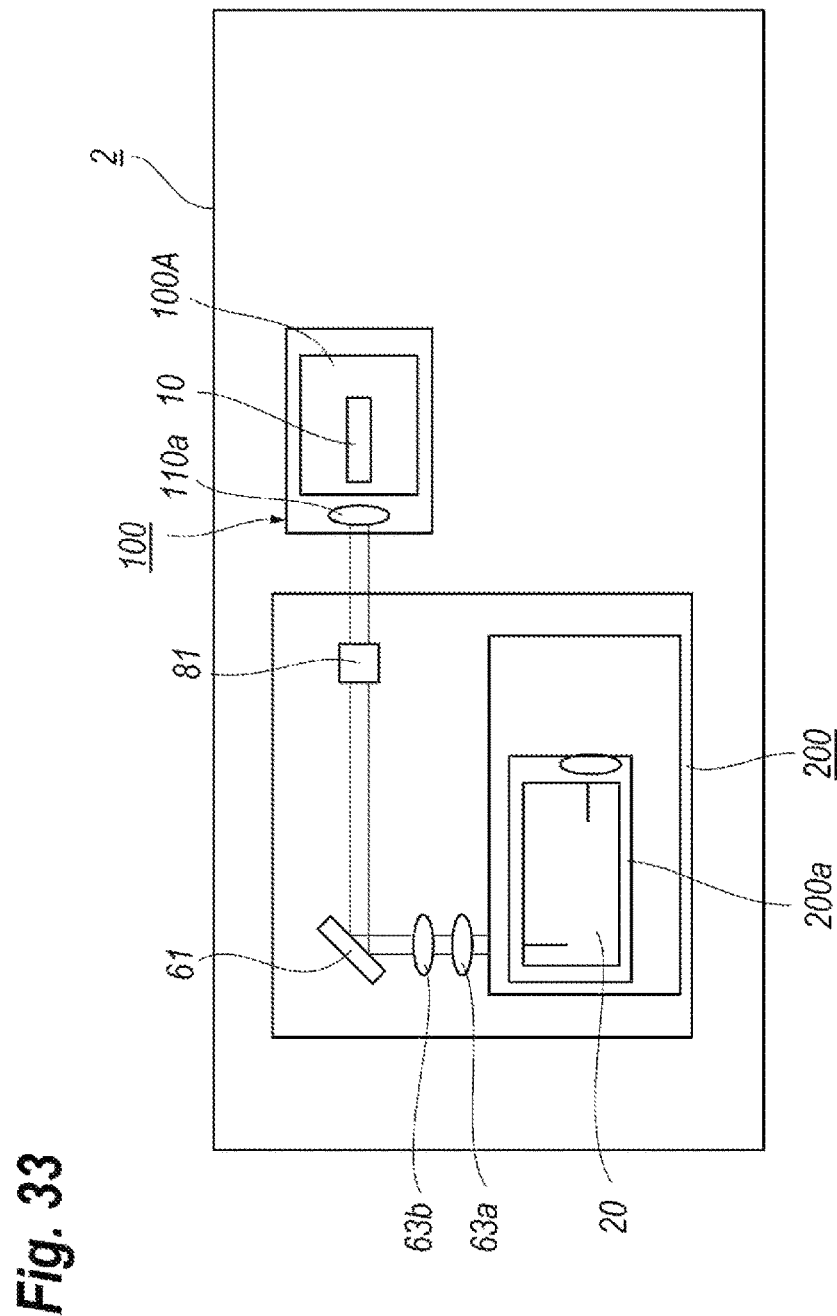
FIG. 33 shows a process to align the first lens and the second lens with the input port of the optical modulator.

FIG. 32 schematically shows a process of setting the BS 61 at step S5a(c). The process first aligns the angle of the BS 61 in 45° against the side wall 2C of the housing 2 using an optical source 91e, a power monitor 91m, a 3 dB coupler 91s, and an auto-collimator 91a. Specifically, setting the side wall 2C of the housing to be an optical reference plane, the auto-collimator 91a is set so as to make an angle of 45° with respect to the side wall 2C. During the preparation of the auto-collimator 91a, the optical beam coming from and reflected to the auto-collimator 91a passes above the housing 2. Then, the BS 61 is first aligned in the rotation angle thereof in the space outside of the housing 2 such that the optical beam reflected by the back surface of the BS 61 and detected by the power monitor 91m through the auto-collimator 91a becomes a maximum. Moving the BS 61 down into the housing 2 as keeping the angle with respect to the side wall 2C, the BS 61 is next adjusted in longitudinal and lateral positions thereof. That is, sliding the BS 61 longitudinally along the optical axis of the beam shifter 81, namely, that of the laser unit 100, and laterally along the optical axis of the input port 24 of the optical modulator 20, a position of the BS 61 is found, at which the monitored beam is detected by the m-PD 64a and/or the m-PD 64b through the optical modulator 20. In this step, two lenses, 63a and 63b, are uninstalled yet and the m-PDs, 64a and 64b, are practically activated. Because the light output from the t-LD 10 is already collimated by the first collimating lens 110a, the determination of the maximum of the monitored beam, that is, the position of the BS 61, may be accomplished.

Among optical components set between the collimating lens 110a and the input port 24 of the optical modulator 20, the beam shifter 81, the BS 61, and the two lenses, 63a and 63b, may shift the optical axis. The optical alignment in the present embodiment, only the two lenses, 63a and 63b, are actively aligned in positions thereof to get the maximum coupling efficiency. Other components, namely, the beam shifter 81 and the BS 61, have functions to roughly align the collimated beam L1 in a position from which the fine alignment for the two lenses, 63a and 63b, becomes possible.

The process of aligning the first lens 63a at step S5a(d), places the first lens 63a in a designed position but yet fixed there. Then, as practically activating the t-LD 10 and guiding the optical beam output from the first lens 63a to the optical modulator 20. Sensing the monitored beam, M2a or M2d, by the m-PDs, 64a or 64b, the position of the first lens 63 is evaluated at which the sensed monitored beam becomes a maximum. Because no biases are supplied to the optical modulator 20, two m-PDs, 64a and 64b, may sense the respective monitored beams, M2a and M2d. Subsequent to the evaluation of the desired position, the first lens 63a is fixed at a position slightly apart from the evaluated position along the optical axis of the input port 24. An ultraviolet curable resin used for the fixation of the first lens 63a usually shrinks during the curing by several micron-meters, which may misalign the position of the first lens 63a. The second lens 63b may compensate this misalignment of the first lens 63a.

The second lens 63b may be aligned as sensing the monitored beam, M2a or M2d, through the optical modulator 20. Specifically, the second lens 63b is slid from the center of the designed position along longitudinally, laterally, and vertically as sensing the monitored beam, M2a or M2d, and is fixed by also an ultraviolet curable resin at the position at which the sensed monitored beam, M2a or M2d, becomes a maximum. Although the ultraviolet resin also shrinks during the curing, which causes deviations from the desirable position determined above, the second lens 63b has positional tolerance far greater than that of the first lens 63a. The first lens 63a has the tolerance only of sub-micron meters, while, the second lens 63b has the positional tolerance thereof far greater, two or three scores greater than that of the first lens 63a. Accordingly, the shrink of the ultraviolet curable resin during the curing is substantially negligible for the second lens 63b. Thus, the optical active alignment of the input unit 210 is completed.

Alignment of Output Unit

The process next assembles the output unit 230 of the modulator unit 200. Because the input unit 210 accompanied with the laser unit 100 and the joint unit 220 is already aligned with the optical modulator 20, the first CW light L1 is practically input to the input port 24 and two output beams, M2b and M2d, are output from the output ports, 22a and 22b, by adjusting the biases to the offset electrodes, 51j to 54j and 51k to 54k, and the quadrature electrodes, 51c to 54c. Setting the special tool 91d at a position where the second lens 73b is to be placed, the first lens 73a is positioned such that the optical beam output from the first lens 73a becomes a collimated beam. Then, the first lens 73a is fixed in a position slightly closer to the optical modulator 20 (step S5b(a)). Accordingly, the optical beam output from the first lens 73a becomes a dispersive beam.

In an alternative, the optical modulator 20 is set such that only one of the output ports, for instance, the output port 22a, generates the modulated beam M2b by adjusting the biases supplied to the electrodes, 51j to 54j, 51k to 54k, and 51c to 54c. The first lens 73a is aligned in a position thereof such that, as detecting the optical beam output from the first lens 73a at a far point through a window set in the first output port 3a, and an initial position of the first lens 73a is determined such that the output beam becomes a collimated beam. The first lens 73a is fixed in a point slightly closer to the optical modulator from the initial position along the optical axis of the first lens 73a. Because the PBC unit 76 is assembled on the carrier 300a, the output beam M2b output from the output port 22a, which is offset from the optical axis of the first output port 3a, may be detected through the first output port 3a as passing through the PBC unit 76. The other first lens 73a optically coupled with the output port 22d of the optical modulator 20 may be similarly aligned with the optical modulator 20 and fixed on the carrier 230a.

The process (S5b(b)) of aligning the second lens 73b will be described. The process first sets a dummy port on the first output port 3a of the housing 2. The dummy port, which emulates the coupling unit 6 practically provided on the output ports, 3a and 3b, includes a coupling fiber and a concentrating lens that concentrates an optical beam entering therein onto the coupling fiber. An optical beam coupled to the coupling fiber may be detected from another end of the coupling fiber.

The process first aligns the second lens 73b to be set for the output beam M2b output from the port 22a. Adjusting the biases supplied to the optical modulator 20, the process sets the optical modulator 20 in a status at which only the output beam M2b is output from the port 22b by eliminating the other beam M2c. Sliding the second lens 73b in a plane in parallel to the carrier 230a, the initial position of the second lens 73b is evaluated at which the optical power detected through the coupling fiber in the dummy port becomes a maximum. Subsequently, procedures same as above described are performed for the other second lens 73b. That is, adjusting the biases supplied to the optical modulator 20, the procedure sets the optical modulator 20 in the status where only the output beam M2c is output from the port 22b by eliminating the other output beam M2b. Then, adjusting the position of the second lens 73b for the other output beam M2c and evaluating the position at which the maximum coupling efficiency is obtained for the coupling fiber by detecting the output power through the coupling fiber in the dummy port. Comparing the maximum output power obtained for the output beam M2b with the maximum output power obtained for the other output beam M2c, the output beam by which a greater output power is obtained is called as the primary beam, while, the other output beam showing a smaller output power is called as the subsidiary beam. The procedure then adjust the position of the second lens 73b of the primary beam such that the output detected through the dummy port becomes equal to the output power for the subsidiary beam. The second lens 73b for the primary beam is fixed thereat. The second lens 73b for the subsidiary beam is fixed at a position the output power detected through the coupling fiber becomes a maximum. Thus, two beams, i.e., the primary beam and the subsidiary beam, may couple with the dummy port in the same coupling coefficient, which is carried out in step S5b(b).

When the maximum output power for the subsidiary beam exceeds a designed power, which is primarily defined by the eye-softer for laser light, the second lens for the primary beam is positioned such that the output power detected through the dummy port becomes equal to the designed maximum and the second lens 73b for the subsidiary beam is also positioned such that the output power detected through the dummy port becomes equal to the designed maximum.

Finally, removing the dummy port from the output port 3a and setting the coupling unit 6 onto the first output port 3a, the alignment of the coupling unit 6 may be carried out as follows: that is, releasing the biases supplied to the optical modulator 20, the two beams, M2b and M2c, output from the output ports, 22a and 22b, couple the coupling unit 6. The coupling unit 6 is aligned such that the output power detected through the coupling fiber in the coupling unit 6 becomes a maximum. The coupling unit has a function to move the coupling fiber in a plane perpendicular to the optical axis thereof and in parallel to the optical axis. Accordingly, moving the coupling fiber relative to the concentrating lens in the coupling unit, the maximum coupling efficiency may be evaluated.

In an alternative, similar to the modified alignment procedures for the second lenses 73b described above, only one of the output beams, M2b and M2c, is coupled with the coupling unit 6 by adjusting the biases supplied to the optical modulator 20, and the position of the coupling fiber relative to the collimating lens in the coupling unit is aligned such that the output power detected through the coupling fiber becomes equal to that obtained in the alignment process for the second lens 73b. When the coupling unit 6 is once aligned for the one of the output beams, M2b and M2c; the other of the output beams, M2b and M2c, may be automatically obtained because the second lens 73b for the other output beam is aligned such that the output power detected through the coupling fiber is equal to the one for the other output beam.

The reason why the second lenses 73b are independently adjusted in the positions thereof such that the output power detected through the coupling unit 6 becomes equal to each other is that the two output beams, M2b and M2c, have respective polarizations perpendicular to each other and each containing transmitting information of 0° and 90° independent to each other. Accordingly, when the output power of the two beams, M2b and M2c, show a large difference, the error rate contained within the transmission information drastically increases.

S5c: Alignment of Detector Unit

Before the alignment of the detector unit 300, the process first aligns the second collimating lens 110b mounted on the base 100a of the laser unit 100 through the lens carrier 110B. The procedure first activates the t-LD 10 and sets the special tool 91d, which is used in the alignment of the other collimating lens 110a, at a position where the first BS 32a is to be placed. The tool 91d carries the second CW light L2 output from the back facet 10B of the t-LD 10 out of the housing 2. Similar to the alignment of the first collimating lens 110a, as monitoring the second CW light L2 at a point apart from the housing 2, and the process aligns the second collimating lens 110b in the point where the monitored CW light L2 becomes a collimated beam. Finally, the second collimating lens 110b is fixed thereat by curing ultraviolet curable resin.

Then, the process aligns two BSs, 32a and 32b. First, as monitoring the second CW light L2 by the first m-PD 34a, the first BS 32a is slid from a designed position along a direction in parallel to the optical axis of the second CW light L2 output from the second collimating lens 110b. The first BS 32a is fixed at the position, slightly apart from a temporal position along the optical axis of the second CW light L2, at which the second CW light L2 monitored by the first m-PD 34a becomes a maximum. The reason why the first BS 32a is slightly slid is that the second CW light L2 reflected by the first BS 32a and entering the second m-PD 34b is refracted by the second BS 32b. The m-PD 34a is set at a position slightly offset from the optical axis of the second CW light L2 because the second CW light L2 passing through the first BS 32a and the etalon filter 33 is refracted thereby. During the alignment of the first BS 32 above, the process does not rotate the BS 32 because the second CW light L2 is converted into a collimated beam having a relatively large field diameter. The second BS 32b is aligned as follows: the process first sets a dummy port, which has the same arrangement with that of the aforementioned dummy port utilized in the alignment process for the output unit 230 of the modulator unit 200, on the second output port 3b of the housing 2. The second BS 32b is aligned such that the optical beam reflected by the second BS 32b and detected through the coupling fiber in the dummy port becomes a maximum.

The optical module 1 may replace the BSs, 32a and 32b, of the parallel plate type with those of the prism type. A BS of the prism type sticks two optical prisms and has a cubic plane shape. The optical alignment of the BS of the prism type may be accomplished by the same procedures with those above described for the parallel plate type. That is, without performing the rotational alignment of the prism BS, the first and second BSs are aligned as sliding parallel and perpendicular to the optical axis of the second CW light L2 output from the second collimating lens 110b to find respective positions at which the optical power detected through the dummy port becomes a maximum. A BS with the prism type inherently has a medium split ratio of about 10:90; that is, 10% of the incident beam may transmit the BS, and the rest 90% thereof may be reflected. Accordingly, the optical output power available at the second output port 3b is reduced to 80% of the optical beam just output from the t-LD 10. On the other hand, a BS with the parallel plate type shows a split ratio of about 5:95, 5% of the incident beam transmits but the rest 95% is reflected. Accordingly, the optical output power available at the second output port 3b becomes 90% of that of the optical beam just output from the back face 10B of the t-LD 10, which is about 10% greater than that available for the BSs for the prism type. The dummy port set on the second output port 3b is replaced by the coupling unit having the arrangements same with those of the coupling unit as aligning the coupling unit on the second output port 3b so as to recover the optical coupling efficiency between the second BS 32b with the coupling port.

S6: RF Wiring

Finally, the process of assembling the optical module 1 performs the wiring from the RF terminals 4 in the rear wall 2B to the signal pads, 41 to 44, on the optical modulator 20. However, the wiring for the RF pads, 41 to 44, may be carried out concurrently with the wiring for the DC terminals, 5a and 5b. Ceiling the housing 2, the process of assembling the optical module 1 is completed.

Modification

The process thus described has an order to assemble respective units, 100 to 300, from the laser unit 100, the input unit 210, the output unit 230, and the detector unit 300. However, the process is not restricted to this order. The alignment of the detector unit 300 may be carried out just after the alignment of the laser unit 100 before the process of aligning the modulator unit 200. Only the limited order is that the alignment of the input unit 210 is necessary to be done before the alignment of the output unit 230, because the latter alignment uses the optical beams, M2b and M2c, output from the optical modulator 20, and these beams, M2b and M2c, derive from the first CW light provided from the input unit 210.

The optical module 1, as described, installs the laser unit 100, the modulator unit 200, and the detector unit 300 within one housing 2, which results in a complex arrangement within the housing 2. However, an optical coherent transceiver implementing the optical module 1 of the invention may simplify the arrangement thereof. Such a coherent optical transceiver is at least unnecessary to install an optical source independently. Also, the optical alignment process between the units becomes unnecessary when the coherent optical transceiver installs the optical module 1 of the invention.

The optical module 1 thus described provides TECs, 11 to 31, independent for the laser unit 100, the modulator unit 200, and the detector unit 300. Accordingly, the respective units, 100 to 300, may be precisely controlled in temperatures thereof depending on calorific amounts of respective units, 100 to 300. The emission wavelength of the t-LD 10 may be precisely controlled independent of the temperatures of the optical modulator 20 and that of the detector unit 300. The optical modulator 20 may be optionally controlled in the operation thereof. The detector unit 300 may precisely determine the emission wavelength of the t-LD 10.

The optical alignment of the collimating lenses, 110a and 110b, utilizes the special tool 91d that takes the optical beams output from the t-LD 10 out of the housing 2, which enables to determine the positions of the collimating lenses at which the optical beams output from the respective lenses, 110a and 110b, become collimated beams. Also, the input unit 210 provides the two-lens system to couple the first CW light L1 with the input port 24 of the optical modulator 20. The two-lens system may compensate the deviation inherently caused during the solidification of the ultraviolet curable resin.

The optical modulator 20 of the embodiment provides the monitor ports, 25a and 25b, that output the monitored beams, M2a and M2d, respectively, which are split from the output beams, M2b and M2c. Accordingly, the monitored beams, M2a and M2d, may be served for the active alignment of the optical components in the input unit 210.

In the foregoing detailed description, the method and module of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An optical module, comprising:
a wavelength tunable laser diode (t-LD) having a first facet and a second facet, the t-LD outputting a first continuous wave (CW) beam from the first facet and a second CW beam from the second facet;
an optical modulator primarily made of semiconductor materials, the optical modulator generating a first output beam by modulating the first CW beam;
a wavelength detector that splits the second CW beam into a monitored beam and a second output beam, the wavelength detector determining an oscillation wavelength of the t-LD;
a housing including a front wall, a rear wall, and two side walls connecting the front wall to the rear wall, the housing enclosing the t-LD, the optical modulator, and the wavelength detector in a space partitioned by the front wall, the rear wall, and the side walls; and
a first output port and a second output port each provided in the front wall of the housing, where the first output port outputs the first output beam, and the second output port outputs the second output beam,
wherein the wavelength detector and the t-LD are arranged on an optical axis of the second output port that extends along one of the side walls, and
wherein the optical modulator is arranged on an optical axis of the first output port that extends along another of the side walls, the optical modulator having an input port, an output port, and a signal pad, the input port being provided in a side of the optical modulator facing the one of the side walls of the housing, the output port being provided in a side of the optical modulator facing the front wall of the housing, and the signal pad being provided in a side of the optical modulator facing the rear wall of the housing, the signal pad providing a signal containing high frequency components.

2. The optical module of claim 1,
further including a first thermo-electric cooler (TEC), a second TEC, and a third TEC, the first TEC being configured to mount the t-LD thereon, the second TEC being configured to mount the optical modulator thereon, and the third TEC being configured to mount the wavelength detector thereon,
wherein the first to third TECs are independent of each other.

3. The optical module of claim 2,
further including a first collimating lens and an input unit, the first collimating lens being configured to collimate the first CW beam output from the front facet of the t-LD, the input unit being configured to optically couple the first CW beam collimated by the first collimating lens with the optical modulator,
wherein the input unit includes a beam splitter (BS) and a lens system including a first lens and a second lens disposed apart from the optical modulator with respect to the first lens, the BS reflecting the first CW beam collimated by the first collimating lens toward the optical modulator, the lens system concentrating the first CW beam reflected by the BS into the input port of the optical modulator.

4. The optical module of claim 3, wherein the first lens is an aspheric lens and the second lens has a convex surface facing the first lens and a plane surface facing the BS.

5. The optical module of claim 3, further including an output unit configured to optically couple the optical modulator with the first output port, the output unit providing another lens system including a first lens and a second lens disposed apart from the optical module with respect to the first lens.

6. The optical module of claim 5, further including a base and a joint unit, the base being configured to mount the optical modulator thereon, the joint unit being mounted on the base and having an interconnection electrically connecting the optical modulator with terminals provided in the one of the side walls, wherein the first CW beam collimated by the first collimating lens is not interfered with the joint unit.

7. The optical module of claim 6, wherein the joint unit has a top surface providing the interconnection thereon, the top surface of the joint unit in a level thereof being lower than the optical axis of the first CW beam connecting the first collimating lens to the input unit.

8. The optical module of claim 6, wherein the optical modulator is mounted in an area of the base overlapped with the second TEC; and wherein the input unit, the joint unit, and the output unit are mounted in another area of the base not overlapped with the second TEC.

9. The optical module of claim 8, further including a wiring substrate configured to supply a bias from a terminal provided in the another of the side walls to the t-LD, wherein the wiring substrate is disposed on a bottom of the housing under the output unit.

10. The optical module of claim 2, further including a second collimating lens configured to collimate the second CW beam output from the second facet of the t-LD, wherein the detector unit includes a first BS and a second BS, the first BS being configured to split the second CW beam output from the second collimating lens, the second BS being configured to split the second CW beam split by the first BS into the monitored beam and the second output beam, the second BS being disposed on the optical axis of the second output port and coupling the second CW beam split thereby with the second output port.

11. The optical module of claim 10, wherein the detector unit further includes an etalon filter, a first monitor photodiode (m-PD), and a second m-PD on the third TEC, wherein the first BS, the etalon filter, and the first m-PD are disposed on an optical axis of the second CW beam output from the second collimating lens, and wherein the first BS, the second BS, and the second m-PD are disposed along a line connecting the first BS to the second BS, the line extending perpendicular to the optical axis of the second CW beam output from the second collimating lens.

* * * * *